(12) United States Patent
Hatta et al.

(10) Patent No.: US 9,825,126 B2
(45) Date of Patent: Nov. 21, 2017

(54) SEMICONDUCTOR DEVICE

(71) Applicant: Mitsubishi Electric Corporation, Chiyoda-ku (JP)

(72) Inventors: Hideyuki Hatta, Tokyo (JP); Naruhisa Miura, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/502,094

(22) PCT Filed: Sep. 7, 2015

(86) PCT No.: PCT/JP2015/075281
§ 371 (c)(1),
(2) Date: Feb. 6, 2017

(87) PCT Pub. No.: WO2016/063644
PCT Pub. Date: Apr. 28, 2016

(65) Prior Publication Data
US 2017/0229535 A1 Aug. 10, 2017

(30) Foreign Application Priority Data

Oct. 20, 2014 (JP) ................................. 2014-213408

(51) Int. Cl.
*H01L 21/70* (2006.01)
*H01L 29/66* (2006.01)
(Continued)

(52) U.S. Cl.
CPC ........ *H01L 29/063* (2013.01); *H01L 21/0465* (2013.01); *H01L 29/1095* (2013.01);
(Continued)

(58) Field of Classification Search
CPC ............... H01L 29/063; H01L 29/7806; H01L 29/7813; H01L 21/0465; H01L 29/7802;
(Continued)

(56) References Cited

U.S. PATENT DOCUMENTS 4,495,513 A 1/1985 Descamps
7,091,080 B2 * 8/2006 Spring ................ H01L 29/1095
257/E29.04
(Continued)

FOREIGN PATENT DOCUMENTS

JP 57-211773 A 12/1982
JP 4-11780 A 1/1992
(Continued)

OTHER PUBLICATIONS

International Search Report dated Nov. 2, 2015 in PCT/JP15/075281 Filed Sep. 7, 2015.

*Primary Examiner* — Su C Kim
(74) *Attorney, Agent, or Firm* — Oblon, McClelland, Maier & Neustadt, L.L.P.

(57) ABSTRACT

A source region of a MOSFET includes a source contact region connected to a source electrode, a source extension region adjacent to a channel region of a well region, and a source resistance control region provided between the source extension region and the source contact region. The source resistance control region includes a low concentration source resistance control region which has an impurity concentration lower than that of the source contact region or the source extension region and a high concentration source resistance control region which is formed between the well region and the low concentration source resistance control region and has an impurity concentration higher than that of the low concentration source resistance control region.

22 Claims, 22 Drawing Sheets

(51) Int. Cl.
*H01L 29/06* (2006.01)
*H01L 29/16* (2006.01)
*H01L 29/10* (2006.01)
*H01L 29/78* (2006.01)
*H01L 21/04* (2006.01)
*H01L 27/07* (2006.01)

(52) U.S. Cl.
CPC .... *H01L 29/1608* (2013.01); *H01L 29/66068* (2013.01); *H01L 29/7802* (2013.01); *H01L 29/7806* (2013.01); *H01L 29/7813* (2013.01); *H01L 27/075* (2013.01)

(58) Field of Classification Search
CPC ............. H01L 29/1095; H01L 29/1608; H01L 29/66068; H01L 27/075
See application file for complete search history.

(56) References Cited

U.S. PATENT DOCUMENTS 9,525,057 B2 * 12/2016 Miura .................... H01L 21/046
2013/0299849 A1 * 11/2013 Tega .................... H01L 29/0607
257/77

FOREIGN PATENT DOCUMENTS

JP 2006-173584 A 6/2006
JP 2013-239554 A 11/2013

\* cited by examiner

F I G . 1
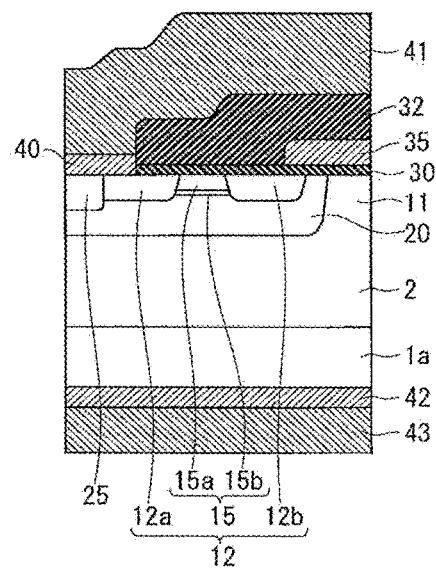
F I G . 2
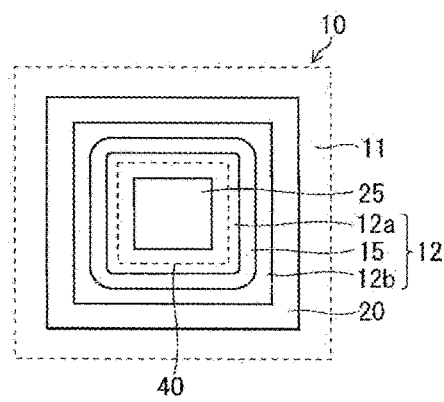

F I G . 3
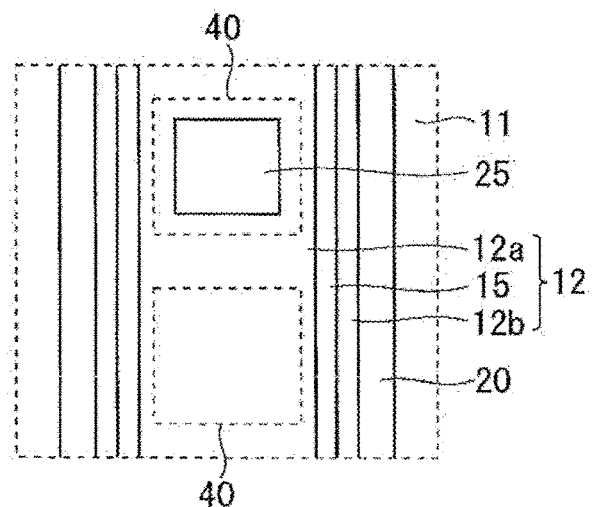
F I G . 4
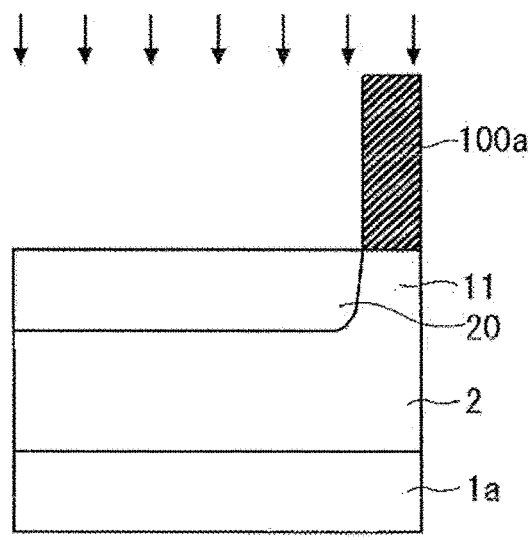

F I G . 5
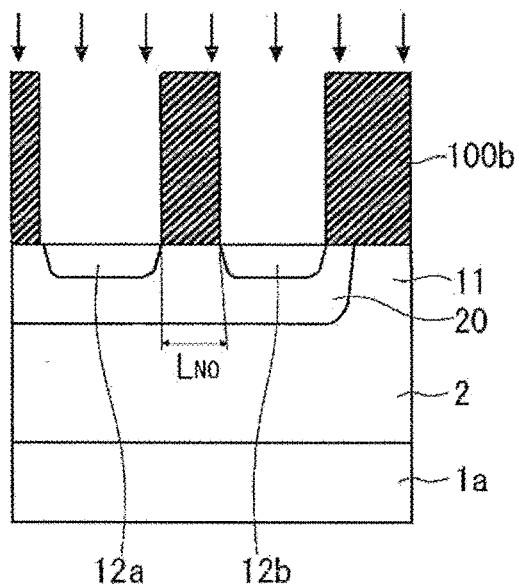
F I G . 6
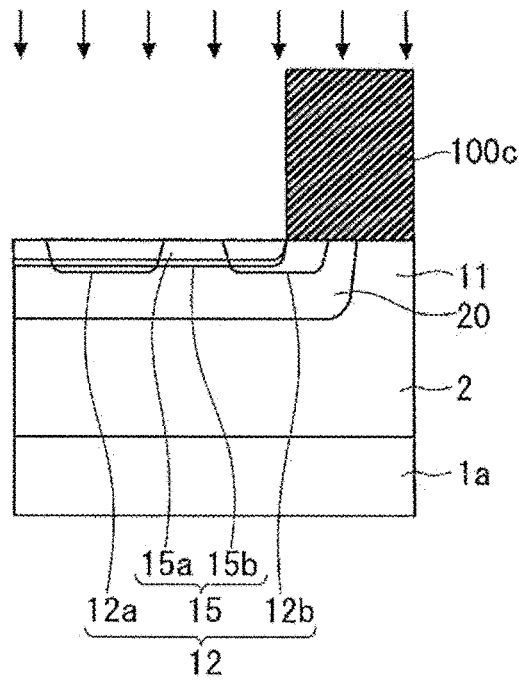

F I G . 7
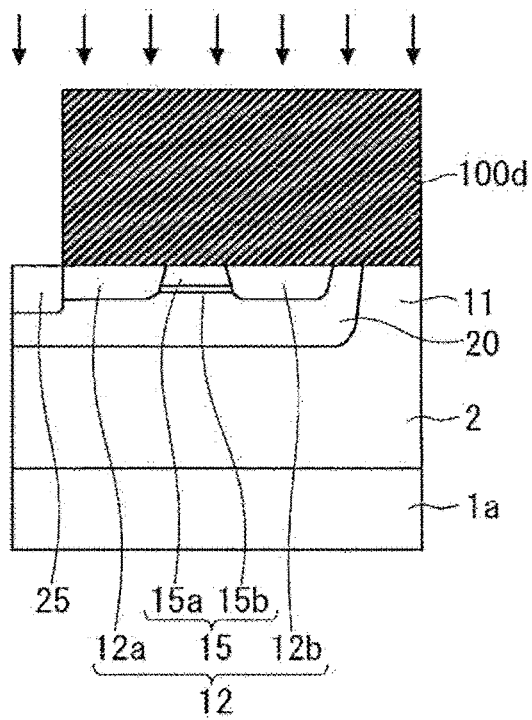
F I G . 8
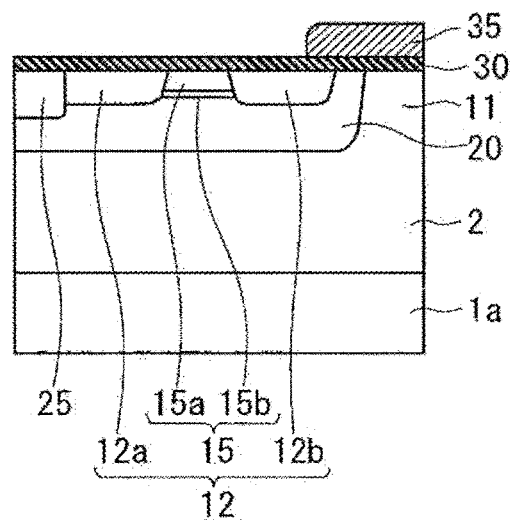

F I G . 1 3
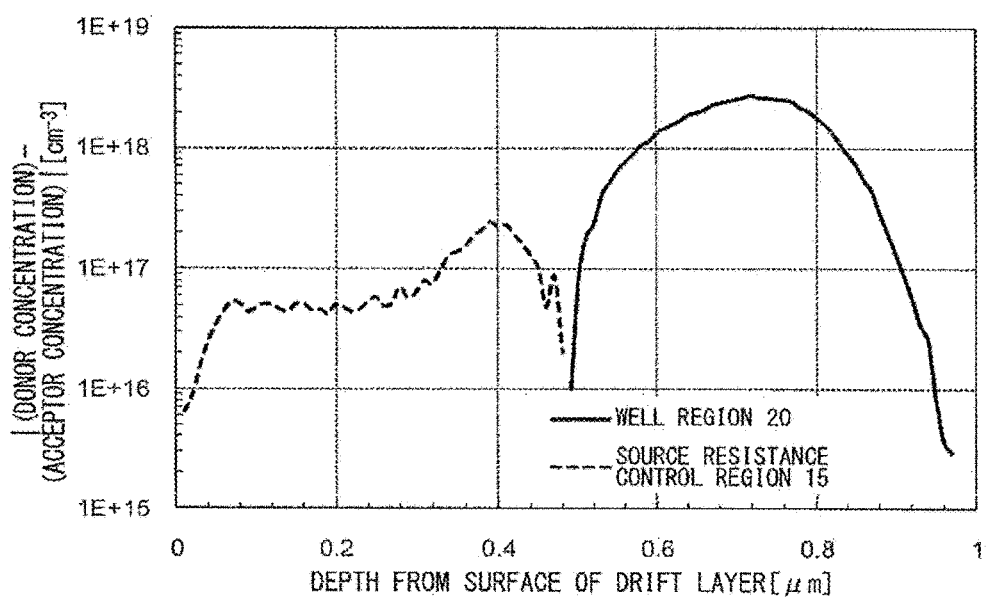

F I G. 1 4
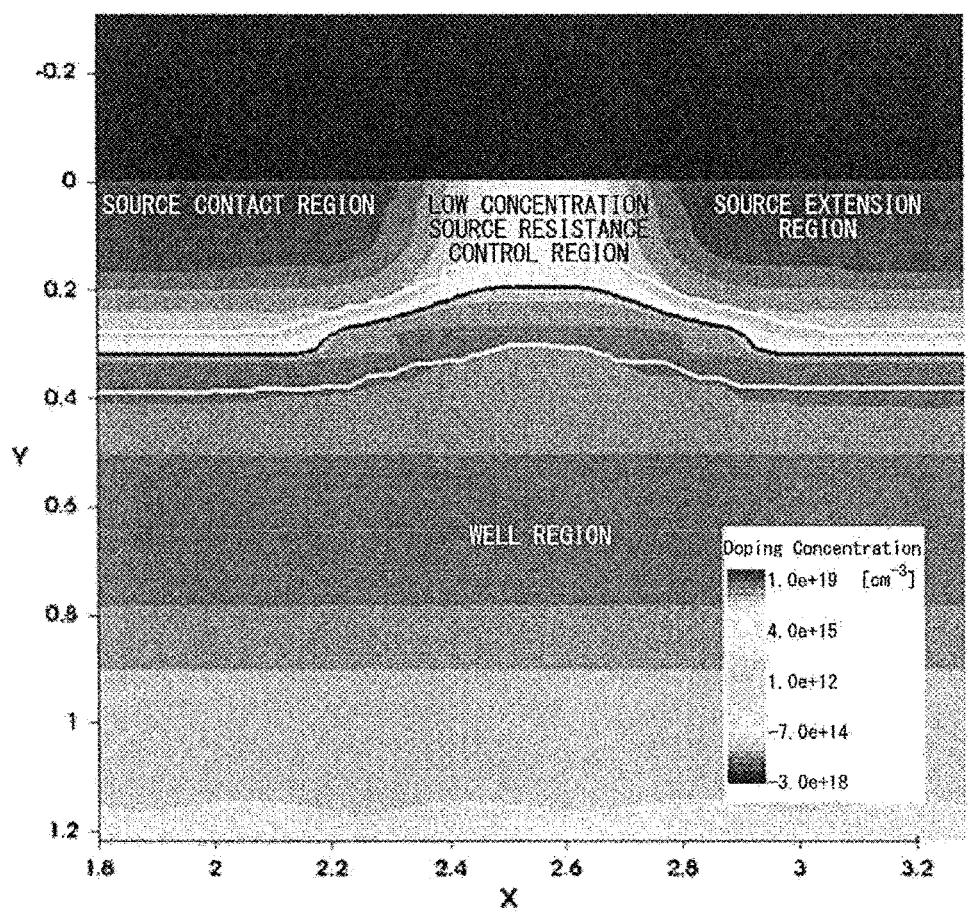

F I G . 1 5
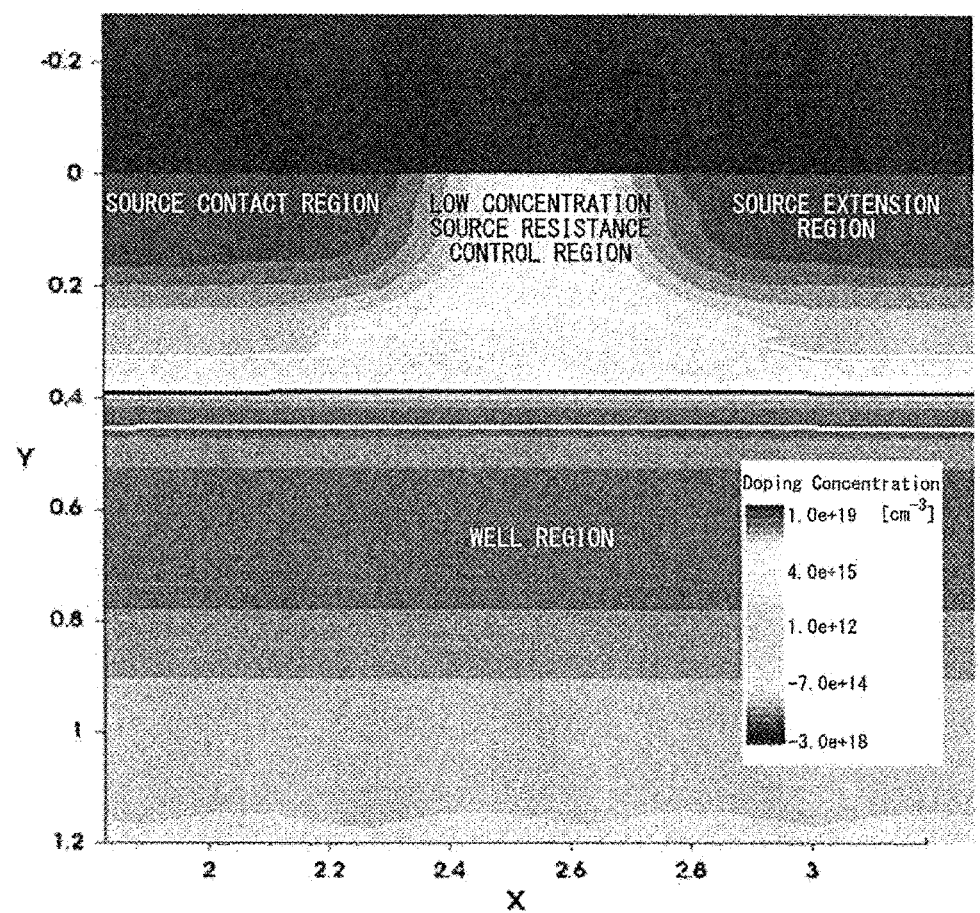

F I G . 2 0
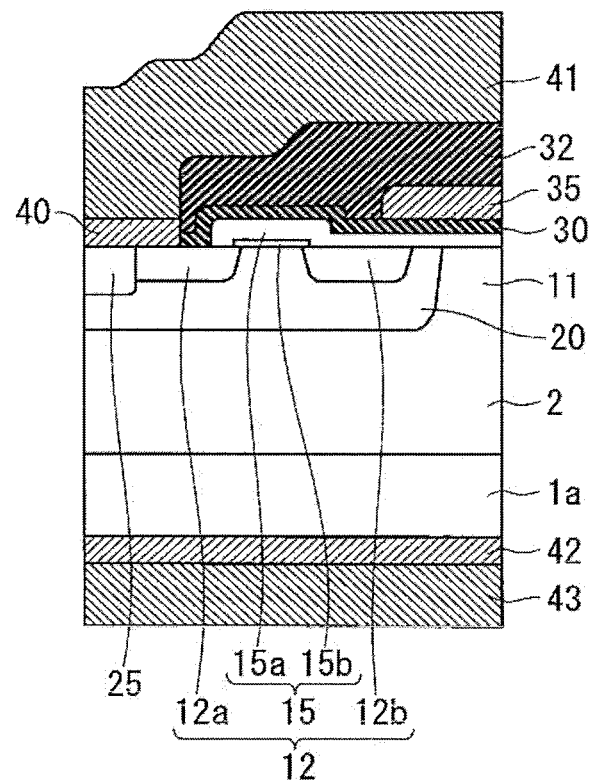
F I G . 2 1
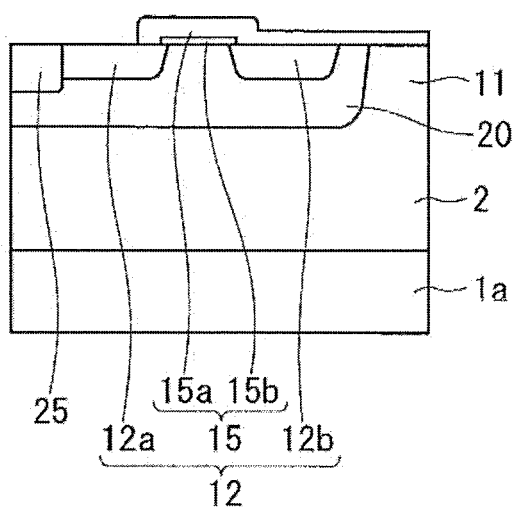

F I G . 3 0
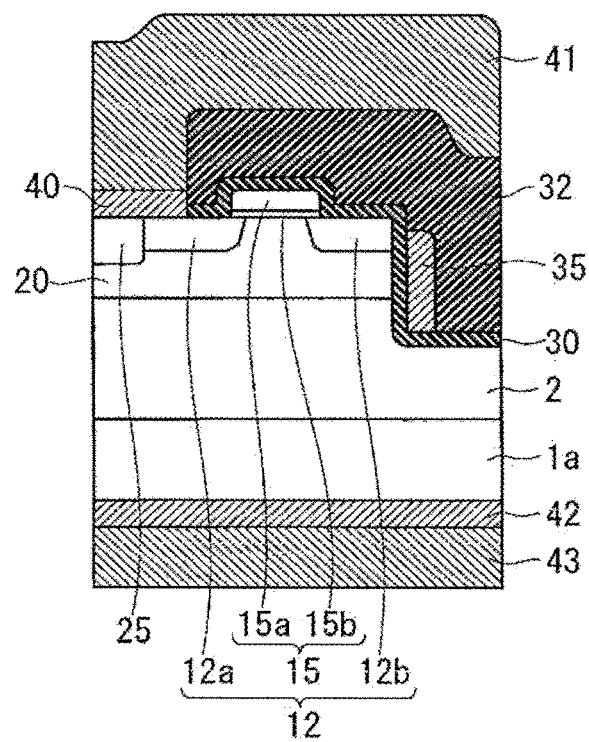
F I G . 3 1
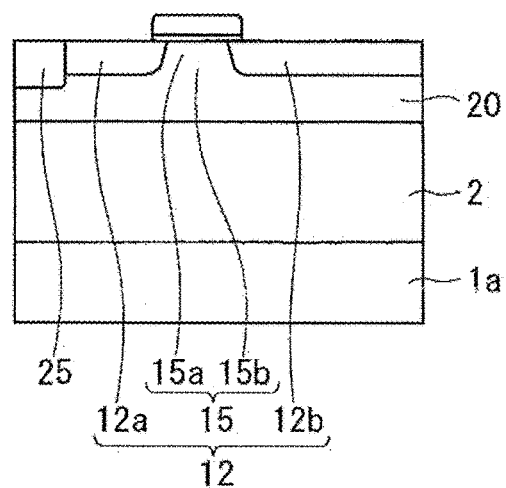

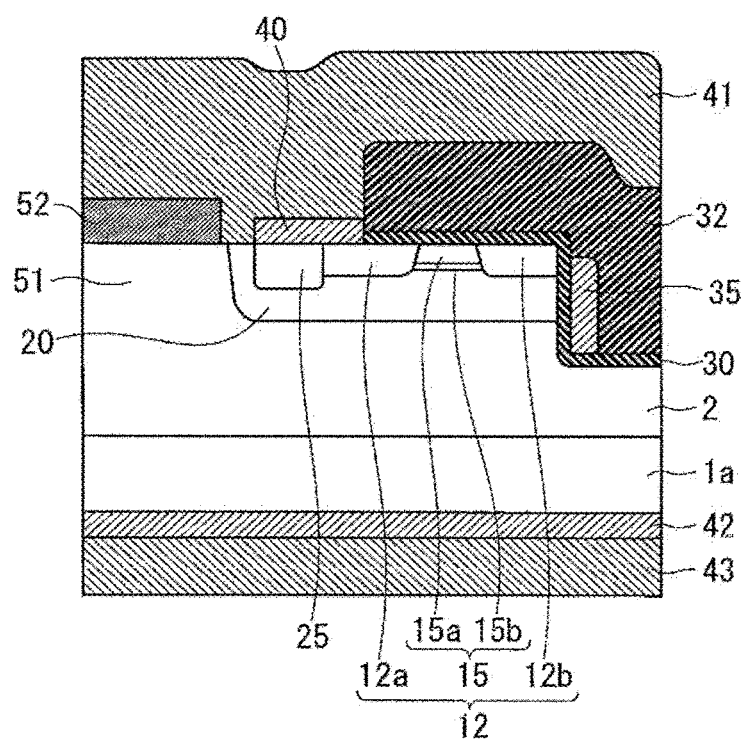
F I G . 4 0

SEMICONDUCTOR DEVICE

TECHNICAL FIELD

The present invention relates to a semiconductor device.

BACKGROUND ART

Semiconductor devices used in a power electronics field include MOSFETs (Metal-Oxide Semiconductor Field Effect Transistor) which are metal/insulator/semiconductor junction field effect transistor and IGBTs (Insulated Gate Bipolar Transistor), for example, and high reliability is required for the semiconductor device from a standpoint of an application to the power electronics.

For example, when, in a state where the MOSFET is applied to an inverter circuit to operate a dielectric load or a resistance load, a load short-circuit such as an arm short-circuit occurs and a high voltage which is a power-supply voltage is applied to a drain electrode of the MOSFET in an on-state, a large current flows through the MOSFET. In the above state, a drain current which is several times to tens of times as large as a rated current is induced on the MOSFET, and it leads to a breakdown of a MOSFET element unless the MOSFET has an appropriate protective function.

To prevent the above problem, there is a method that an excessive drain current (overcurrent) is detected prior to an occurrence of the element breakdown and an off signal is input to a gate electrode in accordance with the detection, so that the drain current is blocked. In the above case, robustness is required for the MOSFET element so that the occurrence of the element breakdown is prevented at least over a period of time from when the load short-circuit, for example, occurs and the overcurrent is detected until when the off signal is input to the gate electrode. That is to say, an excellent short-circuit resistance is strongly desired as one of the high reliability in the semiconductor device. The short-circuit resistance is substantially defined by an amount of time between the generation of the short-circuit and the element breakdown, and the excellent short-circuit resistance indicates that it takes a long time before the element breakdown.

Patent Document 1 discloses a technique of enhancing a short-circuit resistance of a MOSFET. The MOSFET of the Patent Document 1 has a configuration that a source region includes a low-resistance region (a source contact region and a source extension region) and a high-resistance region (a source resistance control region). According to the above configuration, a voltage drop caused by a current flowing in the source resistance control region becomes large then load short-circuit occurs and a saturation current value decreases, so that the short-circuit resistance of the MOSFET is enhanced.

PRIOR ART DOCUMENTS

Patent Documents

[Patent Document 1]: Japanese Patent Application Laid-Open No. 2013-239554

SUMMARY OF THE INVENTION

Problems to be Solved by the Invention

The source region of the MOSFET in the Patent Document 1 has a configuration that the source resistance control region having a high resistance is provided between the source contact region having a low resistance and the source extension region. A resistance value of the source resistance control region can be adjusted by adjusting a length of the source resistance control region (a distance between the source contact region and the source extension region) or an impurity concentration. The Patent Document 1 causes the source resistance control region to have the high resistance by increasing the length of the source resistance control region and reducing the impurity concentration, thereby generating a significant voltage drop in the source resistance control region when the load short-circuit occurs.

However, when a concentration of the source resistance control region is reduced, a depletion layer formed by a p-n junction between a well region and the source resistance control region expands into the source resistance control region even in the on-state in a normal operation, and it may cause an increase in an excessive on-resistance. In the above case, the on-resistance of the element increases in exchange for the reduction in the saturation current, so that a trade-off between the short-circuit resistance and the on-resistance may not be able to be sufficiently improved. Moreover a size dependence in a sheet resistance value of the source resistance control region increases, so that it is also concerned that a variation in the on-resistance of the MOSFET increases.

Considered as a solution to the above problem is increasing a depth of the source resistance control region (a length in a direction perpendicular to a surface of a semiconductor substrate), however, this solution is not preferable by reason that the depth of the source resistance control region needs to be equal to or less than a depth of the well region and it causes a throughput reduction in manufacturing the semiconductor device. Moreover, it is not an effective solution to increase in the impurity concentration of the source resistance control region and also increase the length of the source resistance control region by reason that it causes a reduction in a density of a channel width due to an increase in a cell width of the MOSFET and accordingly, the on-resistance increases.

The present invention has been achieved to solve problems as described above, and it is an object of the present invention to provide a semiconductor device capable of increasing a voltage drop from a channel region to a source electrode while keeping an on-resistance low, thereby enhancing a short-circuit resistance.

Means for Solving the Problems

A semiconductor device according to the present invention includes: a semiconductor substrate; a first conductivity type drift layer formed on the semiconductor substrate; a second conductivity type well region selectively formed on a surface layer part of the drift layer; a first conductivity type source region formed on a surface layer part in the well region; a JFET region which is a part of the drift layer adjacent to the well region; a channel region which is a part of the well region sandwiched between the source region and the JFET region; a gate electrode provided on the drill layer with a gate insulating film therebetween to extend across the source region, the channel region, and the JFET region; a source electrode connected to the source region; and a drain electrode formed on a back surface of the semiconductor substrate, wherein the source region includes: a source contact region formed on the surface layer part in the well region and connected to the source electrode; a source extension region formed on the surface layer part in the well region and adjacent to the channel region; and a source resistance control region provided between the source extension region and the source contact region, and the source resistance control region includes: a low concentration source resistance control region whose first conductivity type impurity concentration is lower than that of the source extension region or the source contact region; and a high concentration source resistance control region which is formed between the well region and the low concentration source resistance control region and whose first conductivity type impurity concentration is higher than that of the low concentration source resistance control region.

Effects of the Invention

According to the semiconductor device of the present invention, the high concentration source resistance control region suppresses an extension of a depletion layer generated between the well region and the source resistance control region, so that a trade-off between a short-circuit resistance and an on-resistance is improved while suppressing an excessive increase in the on-resistance in a normal operation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 A longitudinal sectional view showing a configuration of a semiconductor device according to an embodiment 1.

FIG. 2 A top view showing a layout of a unit cell of the semiconductor device according to the embodiment 1.

FIG. 3 A top view showing a modification example of the layout of the unit cell of the semiconductor device according to the embodiment 1.

FIG. 4 A longitudinal sectional view showing a method of manufacturing the semiconductor device according to the embodiment 1.

FIG. 5 A longitudinal sectional view showing a method of manufacturing the semiconductor device according to the embodiment 1.

FIG. 6 A longitudinal sectional view showing a method of manufacturing the semiconductor device according to the embodiment 1.

FIG. 7 A longitudinal sectional view showing a method of manufacturing the semiconductor device according to the embodiment 1.

FIG. 8 A longitudinal sectional view showing a method of manufacturing the semiconductor device according to the embodiment 1.

FIG. 13 A graph showing a result of a numerical calculation of the |Nd—Na| distribution in the source resistance control region and the well region of an element B shown in FIG. 11.

FIG. 14 A drawing showing a result of a numerical calculation of an impurity concentration distribution around a source region of the element A shown in FIG. 11.

FIG. 15 A drawing showing a result of a numerical calculation of an impurity concentration distribution around a source region of the element B shown in FIG. 11.

FIG. 20 A longitudinal sectional view showing a modification example of the semiconductor device according to the embodiment 2.

FIG. 21 A longitudinal sectional view for describing the method of manufacturing the semiconductor device of FIG. 20.

FIG. 30 A longitudinal sectional view showing a modification example of the semiconductor device according to the embodiment 3.

FIG. 31 A longitudinal sectional view for describing the method of manufacturing the semiconductor device of FIG. 30.

FIG. 40 A longitudinal sectional view showing a configuration of the semiconductor device according to the embodiment 6.

EMBODIMENTS FOR IMPLEMENTING THE INVENTION

Figure 9:
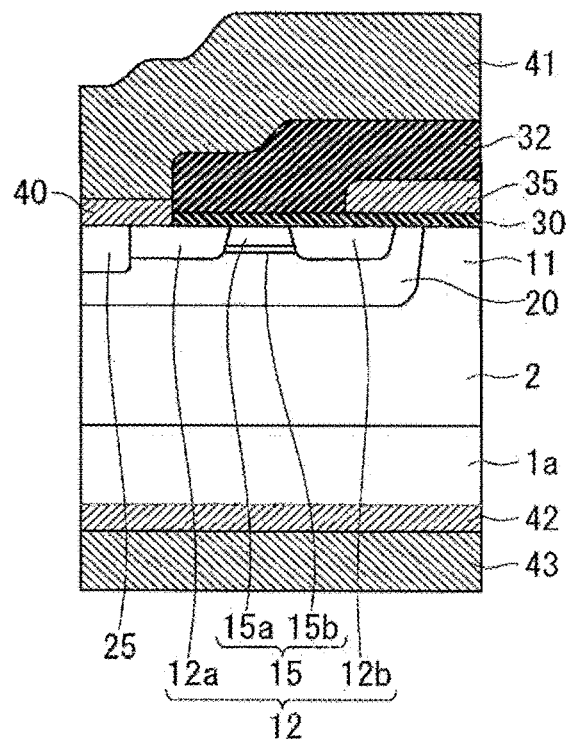
FIG. 9 A longitudinal sectional view showing a method of manufacturing the semiconductor device according to the embodiment 1.

In embodiments described below, "a first conductivity type" is an n-type, and "a second conductivity type" is a p-type as a definition of a conductivity type of an impurity, however, an opposite definition may also be applied. That is to say, "the first conductivity type" may be the p-type, and "the second conductivity type" may be the n-type.

In the present description, each semiconductor element is referred to as "the semiconductor device" as a narrow definition, however, "the semiconductor device" includes, as a wide definition, a semiconductor module which mounts a chip of a semiconductor element, a freewheel diode connected to in reverse parallel with the semiconductor element, and a control circuit which applies a voltage to a gate electrode of the semiconductor element on a lead frame to integrally seal them, for example (a power module such as an inverter module, for example).

Embodiment 1

FIG. 1 is a longitudinal sectional view schematically showing a configuration of a semiconductor device (MOSFET) according to an embodiment 1. A plurality of unit cells are formed in an active region of a semiconductor device. That is to say. FIG. 1 shows a cross-section surface of an arbitrary position in the active region of the semiconductor device and does not include a terminal region provided in an outer side of the active region.

As shown in FIG. 1, the MOSFET of the embodiment 1 is formed using an epitaxial substrate which is made up of a first conductivity type semiconductor substrate 1a and a first conductivity type drift layer 2 (a silicon carbide semiconductor layer) epitaxially grown on the semiconductor substrate 1a. Besides the silicon carbide, silicon or a wide band gap semiconductor which has a larger band gap than the silicon may also be used as a material of the semiconductor substrate and the epitaxial growth layer. The wide band gap semiconductor includes, besides the silicon carbide, gallium nitride, aluminum nitride, and diamond, for example.

A second conductivity type well region 20 is selectively formed in a surface layer part of the drift layer 2. A part 11 adjacent to the well region 20 in the surface layer part of the drift layer 2 is referred to as "a JFET region".

A first conductivity type source region 12 is selectively formed in a surface layer part of the well region 20. A region between the source region 12 and the JFET region 11 in the well region 20 forms a channel when the MOSFET is rendered ON, and is thereby referred to as "a channel region".

As shown in FIG. 1, the source region 12 is made up of a source contact region 12a, a source extension region 12b, and a source resistance control region 15, all of which are the first conductivity type. The source contact region 12a is connected to a source electrode 41 with an ohmic electrode 40 which is ohmic-connected to the source contact region 12a therebetween. The source resistance control region 15 is formed to surround an outer side of the source contact region 12a. The source extension region 12b is formed to surround an outer side of the source resistance control region 15. The source extension region 12b forms an outermost peripheral part of the source region 12 and is adjacent to the channel region.

The source resistance control region 15 includes a low concentration source resistance control region 15a and a high concentration source resistance control region 15b whose impurity concentrations are different from each other. The high concentration source resistance control region 15b is provided in a part between the low concentration source resistance control region 15a and the well region 20, that is to say, a boundary with the well region 20 in the source resistance control region 15. The impurity concentration of the low concentration source resistance control region 15a is set lower than the impurity concentrations of the source contact region 12a and the source extension region 12b. The impurity concentration of the high concentration source resistance control region 15b is set higher than the impurity concentration of the low concentration source resistance control region 15a and lower than or equal to the impurity concentration of the source contact region 12a or the source extension region 12b.

A first conductivity type impurity concentration distribution in the low concentration source resistance control region 15a and the high concentration source resistance control region 15b is preferably even in a direction from the source extension region 12b toward the source contact region 12a. In the above case, controllability of a design value of a source resistance achieved in the source resistance control region 15 increases, and robustness in manufacturing is enhanced.

The impurity concentration of the source contact region 12a may be subequal to the impurity concentration of the source extension region 12b. As described hereinafter, the source contact region 12a and the source extension region 12b can be formed at the same time, and in this case, they have the same impurity concentration distribution.

A second conductivity type well contact region 25 is formed in an inner side of the source contact region 12a. A depth of the well contact region 25 (a length of the well contact region 25 in a direction perpendicular to a surface of the semiconductor substrate 1a) is larger than that of the source contact region 12a. That is to say, the well contact region 25 is formed to pass through the source contact region 12a to reach the well region 20. The well contact region 25 is connected to the source electrode 41 with the ohmic electrode 40 therebetween. Accordingly, the source electrode 41 is electrically connected not only to the source contact region 12a but also the well region 20.

A gate insulating film 30 is formed on a surface of the drift layer 2, and a gate electrode 35 is formed on the gate insulating film 30. The gate electrode 35 extends across the source extension region 12b, the well region 20 (the channel region), and the JFET region 11. Among the source contact region 12a, the source extension region 12b, and the source resistance control region 15 which constitute the source region 12, only the source extension region 12b forms a MOS structure together with the gate insulating film 30 and the gate electrode 35.

An interlayer insulating film 32 is formed on the gate electrode 35. The source electrode 41 is formed on the interlayer insulating film 32. A contact hole is formed in the interlayer insulating film 32 and the gate insulating film 30 so that the source electrode 41 is connected to the source contact region 12a and the well contact region 25, and the ohmic electrode 40 is formed in a bottom part of the contact hole.

A drain electrode 43 is formed on a back surface side of the semiconductor substrate 1a with an ohmic electrode 42 which is ohmic-connected to the semiconductor substrate 1a therebetween.

FIG. 2 is a diagram schematically showing a planar structure of an outermost surface part of a unit cell 10 of the MOSFET. As shown in FIG. 2, the well contact region 25 is formed in a central part of the well region 20. The source contact region 12a is formed in an outer side of the well contact region 25, a source resistance control region 15 is formed in an outer side of the source contact region 12a, and the source extension region 12b is formed in outer side of the low concentration source resistance control region 15a. The part of the well region 20 located in an outer side of the source extension region 12b forms the channel region. Although not shown in FIG. 2, the source resistance control region 15 includes the low concentration source resistance control region 15a and the high concentration source resistance control region 15b.

FIG. 2 shows a forming region of the ohmic electrode 40 (a forming region of the contact hole). The ohmic electrode 40 is in contact only with the source contact region 12a among the source contact region 12a, the source resistance control region 15, and the source extension region 12b, which constitute the source region 12. Accordingly, the source contact region 12a, the source resistance control region 15, and the source extension region 12b are connected in series between the ohmic electrode 40 and the channel region. The source contact region 12a has a high impurity concentration and achieves an ohmic contact having a low contact resistance with the ohmic electrode 40.

At a time of an on-operation or a load short-circuit of the MOSFET, a drain current (an on-current) flowing from the drain electrode 43 into the drift layer 2 passes through the channel region formed in the JFET region 11 and the surface part of the well region 20 (the channel region), then passes through the source extension region 12b, the source resistance control region 15, and the source contact region 12a, and then flows from the ohmic electrode 40 to the source electrode 41.

Although FIG. 2 shows the unit cell 10 having a square planar structure, a shape of the unit cell 10 can be arbitrarily selected, so that a hexagonal shape, an octagon shape, and a circular shape, for example, may also be applied. The MOSFET does not need to have the cell structure made up of the plurality of unit cells 10, so that a comb-like structure shown in FIG. 3 may also be applied. Generally, the comb-like structures is easy to form, however, it has a lower density of the channel width than the cell structure, so that the on-resistance of the element relatively increases.

Next, a method of manufacturing the semiconductor device (MOSFET) according to the embodiment 1 is described. FIGS. 4 to 9 are process drawings for describing the manufacturing method and shows the region shown in FIG. 1, that is to say, a longitudinal section of a region in which a right half of the unit cell 10 is formed.

Firstly, the semiconductor substrate 1a made up of the first conductivity type silicon carbide is prepared. As already described, besides the silicon, the wide band gap semiconductor which has the larger band gap than the silicon may also be used for the semiconductor substrate 1a. The wide band gap semiconductor includes, besides the silicon carbide, gallium nitride, aluminum nitride, and diamond, for example. A plane orientation of the semiconductor substrate 1a can be arbitrarily selected, so that a vertical direction of the surface of the semiconductor substrate 1a may be inclined at an angle of 8 degrees or less, or needs not be inclined. A thickness of the semiconductor substrate 1a may also be arbitrarily selected, so that an approximately 350 μm thickness or an approximately 100 μm thickness may also be applied.

Subsequently, the first conductivity type drift layer 2 is formed on the semiconductor substrate 1a by an epitaxial crystal growth. The impurity concentration of the first conductivity type of the drift layer 2 is set to approximately $1 \times 10^{13}$ cm$^{-3}$ to $1 \times 10^{18}$ cm$^{-3}$, and its thickness is set to 3 μm to 200 μm.

Although the impurity concentration distribution of the drift layer 2 is preferably even in the thickness direction, it needs not be even, so that the impurity concentration may be intentionally increased near the surface, for example, or may also be decreased on the contrary. When the impurity concentration is increased near the surface of the drift layer 2, an effect of reducing a resistance of the JFET region which is formed afterwards and an effect of enhancing a channel mobility can be obtained, and moreover, a threshold voltage of the element can be set low. When the impurity concentration is decreased, an electrical field generated in the gate insulating film 30 at a time of applying a reverse bias to the element is reduced, so that a reliability of the element is enhanced and moreover, the threshold voltage of the element can be set high.

Subsequently, as shown in FIG. 4, an implantation mask 100a (for example, a resist or a silicon oxide film) processed by a photoengraving processing is formed, and the second conductivity type well region 20 is formed by a selective ion implantation using the implantation mask 100a. When the ion implantation is performed, the semiconductor substrate 1a is preferably heated at 100° C. to 800° C., however, the semiconductor substrate 1a needs not be heated. With respect to an impurity (a dopant) which is ion-implanted, nitrogen or phosphorus is preferable as the first conductivity type impurity, and aluminum or boron is preferable as the second conductivity type impurity.

A depth of a bottom of the well region 20 needs to be set so as not to exceed a bottom of the drift layer 2, and is thereby set to approximately 0.2 μm to 2.0 μm, for example. A maximum impurity concentration of the well region 20 is set higher than the impurity concentration near the surface of the drift layer 2, and is thereby set to $1 \times 10^{15}$ cm$^{-3}$ to $1 \times 10^{19}$ cm$^{-3}$, for example. As for the neighborhood of the outermost surface of the drift layer 2, the impurity concentration of the second conductivity type of the well region 20 may be lower than that of the first conductivity type of the drift layer 2 so as to enhance the conductivity of the channel region.

Next, as shown in FIG. 5, the first conductivity type source contact region 12a and the source extension region 12b are formed by a selective ion implantation using an implantation mask 100b (a resist or a silicon oxide film) processed by a photoengraving processing.

The implantation mask 100b has the separated openings in the forming region of the source contact region 12a and the forming region of the source extension region 12b, so that source contact region 12a and the source extension region 12b are separately formed. A length $L_{N0}$ of the source resistance control region 15, which is to be formed subsequently, is determined by a distance between the opening of the forming region of the source contact region 12a and the opening of the forming region of the source extension region 12b in the implantation mask 100b. $L_{N0}$ is 0.1 μm to 10 μm, for example, however, the length within a range of 0.1 μm to 3 μm is effective so that the decrease in the density of the channel width is suppressed without excessively increasing a cell pitch of the unit cell 10.

The depths of bottoms of the source contact region 12a and source extension region 12b are set so as not to exceed the bottom of the well region 20. The impurity concentrations of the source contact region 12a and source extension region 12b are larger than the impurity concentration of the well region 20 in each region, and their maximum impurity concentration is set to approximately $1 \times 10^{18}$ cm$^{-3}$ to $1 \times 10^{21}$ cm$^{-3}$, for example.

When the source contact region 12a and the source extension region 12b are formed at the same time as described above, they are easily formed, and moreover, a manufacturing cost can be reduced by a reduction in a total number of processing.

Next, as shown in FIG. 6, the first conductivity type source resistance control region 15 (the low concentration source resistance control region 15a and the high concentration source resistance control region 15b) are formed by a selective ion implantation using an implantation mask 100c (a resist, for example) processed by a photoengraving processing.

Although in FIG. 6, the source resistance control region 15 is formed to overlap the source contact region 12a and the source extension region 12b, these regions have the same conductivity type (the first conductivity type), so that in the process drawings from FIG. 7, the source resistance control region 15 is illustrated only between the source extension region 12b and the source contact region 12a. The length of the source resistance control region 15 is defined as a clearance between the source contact region 12a and the source extension region 12b.

The low concentration source resistance control region 15a is formed to preferably have the impurity concentration smaller by at least one digit than the source contact region 12a or the source extension region 12b. The high concentration source resistance control region 15b is formed to preferably have the impurity concentration larger by at least one digit than the low concentration source resistance control region 15a.

Each thickness of the low concentration source resistance control region 15a and the high concentration source resistance control region 15b (a length of the drift layer 2 in a depth direction) needs to be approximately 0.1 μm to 3.0 μm. The length of the source resistance control region 15 needs to be approximately 0.1 μm to 5 μm.

When the thickness of the high concentration source resistance control region 15b is approximately equal to or smaller than a thickness of a depletion layer in a p-n junction between the high concentration source resistance control region 15b and the well region 20, an effect described below can be obtained. At the time of the on-state in the normal operation (referred to as "the normal on-state" hereinafter), an expansion of a depletion layer into the low concentration source resistance control region 15a is restricted, and an increase in the on-resistance of the MOSFET is suppressed. At the time of the load short-circuit, a saturation current is decreased by a voltage drop generated in the low concentration source resistance control region 15a, so that a short-circuit resistance of the MOSFET is enhanced. As a result, a trade-off between the short-circuit resistance and the on-resistance is improved.

In contrast, when the thickness of the high concentration source resistance control region 15b is larger than the thickness of the depletion layer in the p-n junction between the high concentration source resistance control region 15b and the well region 20 (when the high concentration source resistance control region 15b is not completely depleted), an effect described below can be obtained. At the time of the load short-circuit, a reverse bias is applied between the source resistance control region 15 and the well region 20 by a voltage drop generated in the source resistance control region 15, and the depletion layer expands. A current pathway is narrowed by the expansion of the depletion layer, and an effect of increasing the resistance of the source resistance control region 15, that is to say, a resistance modulation effect can be obtained.

When the high concentration source resistance control region 15b is in contact with the well region 20 which has the higher impurity concentration, to some extent, than the high concentration source resistance control region 15b, the resistance modulation effect in the source resistance control region 15 increases as the impurity concentration of the high concentration source resistance control region 15b becomes higher. Accordingly, in a condition where the high concentration source resistance control region 15b is not completely depleted, the resistance modulation effect in the source resistance control region 15 can be increased by increasing the impurity concentration of the high concentration source resistance control region 15b. When the source resistance control region 15 having the large resistance modulation effect is formed, the thickness of the high concentration source resistance control region 15b is preferably made as small as possible to the extent that the high concentration source resistance control region 15b is not completely depleted in the normal on-state.

The conductivity type of the low concentration source resistance control region 15a may be the second conductivity type in accordance with the impurity which is ion-implanted into the well region 20.

The source resistance control region 15 is preferably in contact with a part of the well region 20 which has the high impurity concentration so that the depletion layer generated between the source resistance control region 15 and the well region 20 is expanded into the source resistance control region 15 more effectively at the time of the load short-circuit. When the source resistance control region 15 which has the same thickness and indicates the same resistance value, the high concentration source resistance control region 15b can be made to have the higher concentration by causing the high concentration source resistance control region 15b to contact the well region 20 having the high concentration. As a result, the source resistance control region 15 having the large modulation effect at the time of the load short-circuit can be obtained. For example, when the impurity concentration distribution of the well region 20 has a retro-grade profile in a depth direction, the source resistance control region 15 having the large resistance modulation effect at the time of the load short-circuit is obtained by causing the high concentration source resistance control region 15b and the well region 20 to contact each other in a deeper position.

The low concentration source resistance control region 15a and the high concentration source resistance control region 15b may be formed by one stage of ion implantation at the same time, or may be formed by a plurality of stages of ion implantation. The impurity concentration distribution of the low concentration source resistance control region 15a and the high concentration source resistance control region 15b may have the retro-grade profile or a step-like profile with at least two stages.

With regard to the depth to form the high concentration source resistance control region 15b, FIG. 6 shows an example that a depth of a lower end of the high concentration source resistance control region 15b is smaller than that of the source contact region 12a or the source extension region 12b. However, a lower end of the source contact region 12a or the source extension region 12b may be located between an upper end and the lower end of the high concentration source resistance control region 15b. Alternatively, the upper end of the high concentration source resistance control region 15b may be located in a deeper position than the lower end of the source contact region 12a or the source extension region 12b.

In the invention of the present application, the first conductivity type low concentration source resistance control region 15a having the low impurity concentration is inserted into the source region 12, so that the resistance of the source region 12 is intentionally increased under control, and particularly, the modulation effect of at least approximately the on-resistance of the MOSFET is obtained. In contrast, in the source contact region 12a and the source extension region 12b, the first conductivity type impurity concentration is increased to reduce a sheet resistance so that a parasitic resistance of the MOSFET is decreased and moreover, a contact resistance with the ohmic electrode 40 is decreased.

After forming the source resistance control region 15, as shown in FIG. 7, the second conductivity type well contact region 25 is formed by a selective ion implantation using an implantation mask 100d processed by a photoengraving processing. The well contact region 25 is formed so that its bottom reaches the second conductivity type well region 20. The second conductivity type impurity concentration of the well contact region 25 is set higher than that of the well region 20 to obtain a favorable connection between the well region 20 and the source electrode 41. The ion implantation is preferably performed at a substrate temperature of 150° C. or above. This enables a formation of the well contact region 25 having the low sheet resistance.

Subsequently, a thermal treatment of electrically activating the impurity implanted into the drift layer 2 is performed. The thermal treatment is preferably performed in an inactive gas atmosphere such as argon or nitrogen, for example, or in vacuum at a temperature of 1500° C. to 2200° C. for 0.5 to 60 minutes. The thermal treatment may be performed in a states where the surface of the drift layer 2 is covered with a film which is made up of carbon or the surface of the drift layer 2, the back surface of the semiconductor substrate 1a, and each end surface of the semiconductor substrate 1a and drift layer 2 are covered with a film which is made up of carbon. Accordingly, a roughness of the surface of the drift layer 2, due an etching caused by a reaction with a residual moisture or a residual oxygen in the device at the time of thermal treatment, can be suppressed.

Subsequently, a silicon oxide film (a sacrificial oxide film) is formed on the surface of the drift layer 2 by a thermal oxidation, and the oxide film is removed by hydrofluoric acid, so that a processing damage layer formed on the surface is removed and a clean surface is thereby obtained. Then, a silicon oxide film is formed on the drift layer 2 by a CVD (Chemical Vapor Deposition) method, for example, and a patterning is performed on the silicon oxide film to open the active region 7, so that a field oxide film (not shown) is formed in a region located in an outer side of the active region 7. The field oxide film needs to have a thickness of 0.5 µm to 2 µm.

Subsequently, the gate insulating film 30, which is the silicon oxide film, is formed on the surface of the drift layer 2. A method of forming the gate insulating film 30 includes a thermal oxidation method and a deposition method, for example. It is also applicable to perform, after forming the silicon oxide film by the thermal oxidation method or the deposition method, a thermal treatment in a nitride oxidation gas (such as NO or $N_2O$) atmosphere or an ammonia atmosphere and a thermal treatment in an inactive gas (such as argon).

Subsequently, a polycrystalline silicon or a polycrystalline silicon carbide is deposited on the gate insulating film 30 by the CVD method, and a patterning is performed by a photoengraving processing and an etching, so that the gate electrode 35 is formed. As a result, a structure shown in FIG. 8 is obtained.

The polycrystalline silicon and the polycrystalline silicon carbide used for the gate electrode 35 preferably include phosphorus, boron, or aluminum, for example, and have a first or second conductivity type and low sheet resistance. Phosphorus, boron, or aluminum included in the polycrystalline silicon and the polycrystalline silicon carbide may be incorporated during the film formation or may be ion-implanted after the film formation to perform an activation thermal treatment. Furthermore, a material of the gate electrode 35 may be a metal or an intermetallic compound or a multilayer film of the above materials.

Next, the interlayer insulating film 32 is formed on the drill layer 2 by the CVD method, for example. Subsequently, a contact hole for connecting the source electrode 41 to the source contact region 12a and the well contact region 25 (a source contact hole) is formed in the interlayer insulating film 32 by a dry etching method, for example. In a region which is not shown, a contact hole for connecting a gate wiring to the gate electrode 35 (a gate contact hole) is formed in the interlayer insulating film 32. The source contact hole and the gate contact hole may be formed at the same time by the same etching processing. Accordingly, the process steps are simplified and the manufacturing cost can be thereby reduced.

Subsequently, the ohmic electrode 40 is formed on the surface of the drift layer 2 exposed on a bottom of the source contact hole. The ohmic electrode 40 achieves an ohmic contact between the source contact region 12a and the well contact region 25. The method of forming the ohmic electrode 40 in a case where the drift layer 2 is the silicon carbide includes a method that a metal film which is made up mostly of Ni is formed on the entire surface of the interlayer insulating film 32 including the source contact hole, the metal film is caused to be reacted with the silicon carbide by a thermal treatment at a temperature of 600 to 1100° C. to form a silicide film which is to be the ohmic electrode 40, and subsequently, the residual metal film which remains unreacted on the interlayer insulating film 32 is removed by a wet etching using a nitric acid, a sulfuric acid, or a hydrochloric acid or a mixture of one of those acids and a hydrogen peroxide solution. The thermal treatment may be performed again after removing the metal film which remains on the interlayer insulating film 32. In the above case, when the thermal treatment is performed at a higher temperature than the previous thermal treatment, the ohmic contact having a lower contact resistance is formed.

When the gate contact hole (not shown) is formed prior to the processing of forming the ohmic electrode 40, the ohmic electrode made up of a silicide is also formed in a bottom of the gate contact hole. When the gate contact hole is not formed prior to the processing of forming the ohmic electrode 40, an etching for forming the gate contact hole in the interlayer insulating film 32 is performed after forming the ohmic electrode 40.

The whole of the ohmic electrode 40 may be made up of a single intermetallic compound or alternatively, a part which is connected to the second conductivity type region and a part which is connected to the first conductivity type region may be made up of different intermetallic compounds appropriate to each part. It is important for reducing the on-resistance of the MOSFET that the ohmic electrode 40 has the ohmic contact resistance which is sufficiently low with respect to the first conductivity type source contact region 12a. In contrast, it is preferable that the ohmic electrode 40 has the ohmic contact resistance which is sufficiently low with respect to the second conductivity type well contact region 25 from a viewpoint of a fixation of the well region 20 to a ground potential or an enhancement in a forward direction characteristic of a body diode built into the MOSFET. The both can be achieved by separately making the part which is connected to the second conductivity type region and the part which is connected to the first conductivity type region in the ohmic electrode 40. This can be achieved by performing a patterning of the metal film for forming a silicide film on each part using a photoengraving processing.

A silicide film which is to be the ohmic electrode 42 is also formed in a similar manner in the back surface of the semiconductor substrate 1a during a process of forming the ohmic electrode 40 on the drift layer 2. The ohmic electrode 42 has an ohmic contact with the semiconductor substrate 1a, and a favorable connection is achieved between the drain electrode 43 which will be formed subsequently and the semiconductor substrate 1a.

Subsequently, a predetermined metal film is formed by a sputter method or an evaporation method and a patterning is performed on the metal film, so that the source electrode 41 is formed on the interlayer insulating film 32. The gate wiring which is not shown but is connected to the gate electrode 35 is also formed using the same metal film as the source electrode 41. Considered as the above metal film are a film of Al, Ag, Cu, Ti, Ni, Mo, W, or Ta, a nitride of one of those materials, a laminated film of two or more of those materials, and an alloy film of two or more of those materials, for example. Moreover, a metal film such as Ti, Ni, Ag, or Au, for example, is formed on the ohmic electrode 42 on the back surface of the semiconductor substrate 1a to form the drain electrode 43, and the MOSFET having a configuration shown in FIG. 9 is thereby completed.

Although the illustration is omitted, an upper surface of the MOSFET may be covered with a protection film made up of a silicon nitride film or a polyimide, for example. The protection film is provided with an opening to connect an external control circuit to the source electrode 41 and the gate wiring. That is to say, each of a part of the source electrode 41 which is exposed to the opening of the protection film and a part of the gate wiring which is exposed to the opening of the protection film is used as a pad for the external connection.

Furthermore, the semiconductor substrate 1a may be ground from its back surface side, after forming the protection film, to have a thickness of approximately 100 µm. In the above case, a grinding surface is cleaned after thinning the semiconductor substrate 1a and a metal film which is made up mostly of Ni is formed on the entire surface of the back surface, and subsequently, a silicide film is formed on the back surface of the semiconductor substrate 1a by a local heating method such as a laser anneal, for example, to form the ohmic electrode 42. Subsequently, the drain electrode 43 made up of a metal film of Ti, Ni, Ag, or Au is formed on the ohmic electrode 42 in a similar manner to the above processing.

Figure 10:
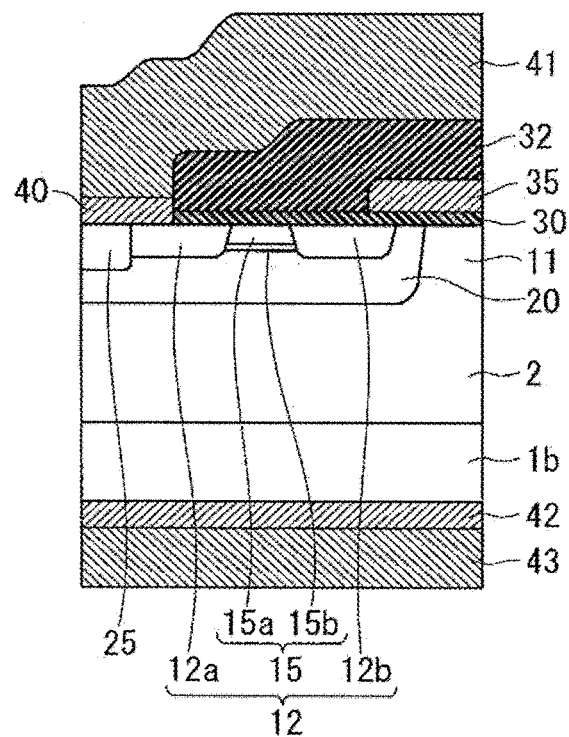
FIG. 10 A longitudinal sectional view showing a method of manufacturing the semiconductor device according to the embodiment 1.

In the present embodiment, the MOSFET is described as an example of the semiconductor device to which the present invention is applied, however, as shown in FIG. 10, the present invention can also be applied to an IGBT in which the second conductivity type semiconductor substrate 1b is used instead of the first conductivity type semiconductor substrate 1a. In the IGBT, the source region 12 corresponds to "an emitter region", the well region 20 corresponds to "a base region", and the semiconductor substrate 1b corresponds to "a collector region". Since an emitter resistance can be made high by providing a resistance control region having a high resistance (the source resistance control region 15) in the emitter region (the source region 12), a current gain in a parasitic transistor made up of the emitter region (the source region 12), the base region (the well region 20) and the drift layer 2 can be made small, and as a result, obtained is an effect that a latch-up caused by an operation of a parasitic thyristor of the IGBT can be prevented.

According to the embodiment 1, the source resistance control region 15, which is formed by the processing different from that of the source contact region 12a and the source extension region 12b, is inserted in series into a pathway from the channel region of the well region 20 to the ohmic electrode 40 and the source electrode 41, so that an effective source resistance can be changed by changing the impurity concentration of the low concentration source resistance control region 15a, for example.

Although a drain saturation current which has an influence on an amount of the short-circuit resistance is proportional to a square of a gate/source voltage applied to the channel, when there is the significant source resistance as the present invention, the effective gate/source voltage is obtained by subtracting a product of the source resistance and the drain current. Accordingly, when the source resistance is made large, the saturation current is made small, so that the short-circuit resistance can be made high.

However, too large source resistance causes an increase in a conduction loss in the normal on-state and is not preferable. Furthermore, in a state where the first conductivity type impurity concentration in the source region is approximately even in a horizontal direction as a conventional MOSFET, when the source resistance is increased, a contact resistance between a source region and a source pad (an ohmic electrode) is increased, so that a loss in the element is further increased. In the present invention, the ohmic electrode 40 which is connected to the source electrode 41 is in contact only with the source contact region 12a having the low resistance, and is not in contact with the low concentration source resistance control region 15a having the high resistance. The contact resistance between the ohmic electrode 40 and the source region 12 can be therefore kept low. Accordingly, it is possible to design the source resistance which enables a reduction in the saturation current while suppressing the excessive increase in the on-resistance.

In the meanwhile, in the embodiment 1, the source extension region 12b has the first conductivity type impurity concentration distribution, which is the same as the source contact region 12a, and has the low sheet resistance. It is generally necessary that an end part of the channel region on a source side has the gate insulating film 30 and the gate electrode 35 right above itself, and the end part is disposed in an inner side of an end part of the gate electrode 35 and overlaps the gate electrode 35 to reduce a connection resistance with the channel region.

When a silicon carbide semiconductor device having a MOS structure is manufactured, a self-aligned process, as widely applied in manufacturing a conventional semiconductor device using silicon, of implanting for formation of the source region and performing an activation annealing after forming the gate electrode cannot be applied, so that a sufficient margin is provided for a misalignment of the source region and the gate electrode in a photoengraving processing during each patterning of the source region and the gate electrode.

Accordingly, in the source region, the region overlapping the gate electrodes accumulates a carrier in a MOS interface and thereby has the low resistance in the on-state, however, in the region which does not overlap the gate electrode, the sheet resistance itself has an influence on the source resistance. Thus, when the entire source region is caused to have the high sheet resistance for a purpose of reducing the saturation current, the length of the part which does not overlap the gate electrode contributes to the amount of the saturation current. The part of the source region which does not overlap the gate electrode depends on an alignment accuracy with the gate electrode, so that a variation of the source resistance may occur in the unit cell (when the part which does not overlap the gate electrode is reduced in length, the source resistance decreases, and when the part which does not overlap the gate electrode is increased in length, the source resistance increases). The source resistance has an influence on the effective gate voltage applied to the channel region, so that the variation of the source resistance causes an unbalance of the saturation current value in the unit cell and is not preferable.

In the present embodiment, the sheet resistance of the source extension region 12b which overlaps the gate electrode 35 is set low enough to have less influence on the reduction in the effective gate voltage. The source resistance control region 15 is not overlapped with the gate electrode 35. The length of the source resistance control region 15, that is to say, the clearance between the source contact region 12a and the source extension region 12b is determined by a width of the implantation mask 100b formed in one photoengraving processing (the length $L_{NO}$ shown in FIG. 5) and therefore does not depends on the alignment accuracy. Accordingly, the occurrence of the unbalance of the saturation current in the unit cell 10 can be prevented.

Particularly, with regard to the element having the MOS structure using the silicon carbide, it is known that when the thermal oxidation, for example, is performed on a region having a large impurity implantation amount, an enhanced oxidation, which indicates an increase in an oxidation rate compared with a region on which the implantation is not performed, occurs. In the embodiment 1, the source extension region 12b having the low sheet resistance, that is to say, having the large impurity implantation amount forms the MOS structure in the end part of the gate electrode 35, so that when the gate insulating film 30 is formed by the thermal oxidation, the thickness of the oxide film can be made large in the end part of the gate electrode 35. As a result, a gate electrical field is weakened in the end part of the gate electrode 35, and the element having a higher reliability is formed. This is also one of the reasons why the low concentration source resistance control region 15a is not overlapped with the gate electrode 35.

According to the semiconductor device according to the embodiment 1, the source region 12 includes the structure of connecting in series the source contact region 12a which is in contact with the ohmic electrode 40 which is connected to the source electrode 41, the source extension region 12b which is adjacent to the channel region, and the source resistance control region 15 located between the source contact region 12a and the source extension region 12b, so that the saturation current can be controlled by the source resistance according to the sheet resistance of the source resistance control region 15. Furthermore, the high concentration source resistance control region 15b formed below the low concentration source resistance control region 15a enables the suppression of the expansion of the depletion layer generated between the source resistance control region 15 and the well region 20 in the normal on-state and the increase in the resistance modulation effect at the time of the short-circuit, so that the saturation current at the time of the load short-circuit can be further decreased.

Figure 11:
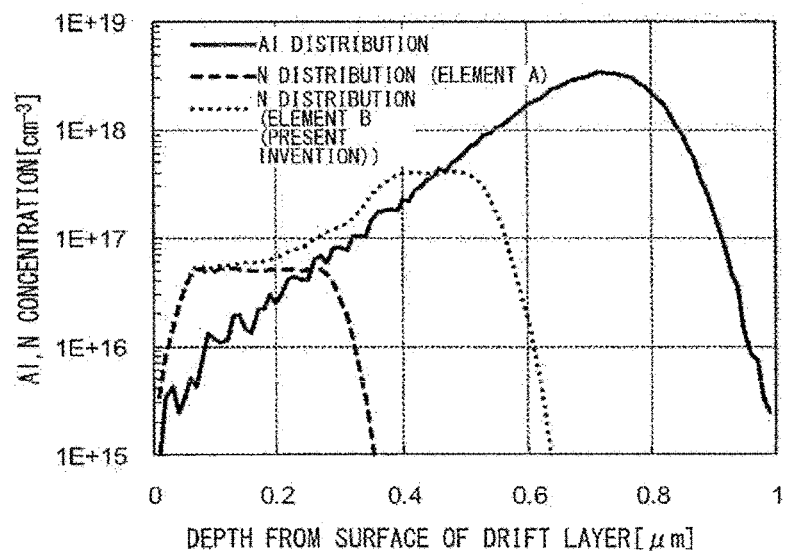
FIG. 11 A graph showing a result of a numerical calculation of an impurity concentration distribution in a source resistance control region and a well region of the semiconductor device according to the embodiment 1.

FIG. 11 is a graph showing a result of a numerical calculation of the impurity concentration distribution in the well region 20 and the source resistance control region 15 when both the well region 20 and the source resistance control region 15 of the silicon carbide MOSFET according to the present embodiment are formed by the ion implantation method. A horizontal axis of the graph in FIG. 11 indicates a depth from the surface of the drift layer 2. Herein, indicated is an example of using nitrogen (N) as the first conductivity type impurity and aluminum (Al) as the second conductivity type impurity.

In FIG. 11, a solid line in the graph indicates a concentration distribution of the second conductivity type impurity (Al) implanted into the well region 20. A dashed line in the graph indicates a concentration distribution of the first conductivity type impurity (N) in the MOSFET (an element A) in which the source resistance control region 15 is made up only of the low concentration source resistance control region 15a. A dotted line in the graph indicates a concentration distribution of the first conductivity type impurity (N) in the MOSFET (an element B) according to the present invention in which the source resistance control region 15 is made up of the low concentration source resistance control region 15a and the high concentration source resistance control region 15b. A region in which the concentration of the first conductivity type impurity (N) is higher than that of the second conductivity type impurity (Al) corresponds to the source resistance control region 15.

Figure 12:
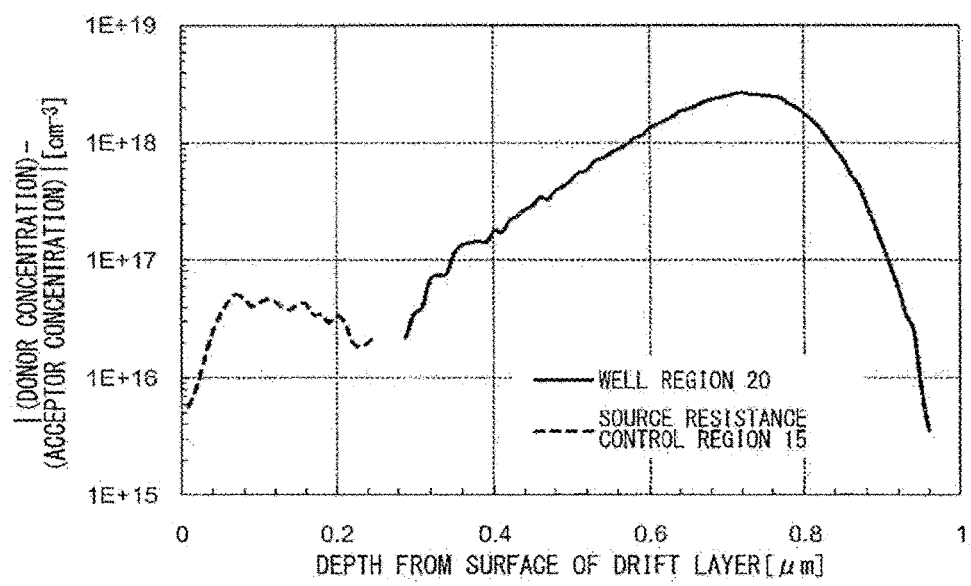
FIG. 12 A graph showing a result of a numerical calculation of |Nd—Na| distribution in the source resistance control region and the well region of an element A shown in FIG. 11.

FIG. 12 shows a distribution of an absolute value of a difference between a donor concentration Na and an acceptor concentration Nd (|Nd—Na| distribution) in the element A shown in FIG. 11. FIG. 13 shows a distribution of an absolute value of a difference between a donor concentration Na and an acceptor concentration Nd in the element B shown in FIG. 11. It is recognized that the element B includes a region having a high donor concentration, which corresponds to the high concentration source resistance control region 15b, in the interface between the source resistance control region 15 and the well region 20.

FIG. 14 shows a simulation result of the impurity concentration at a time of simulating the normal on-state in the element A shown in FIG. 11. A white line corresponds to an outline of the depletion layer. It is recognized that in the element A, even in the normal on-state, the depletion layer enters deeply the low concentration source resistance control region 15a and the current pathway is narrowed, so that the on-resistance is increased.

FIG. 15 shows a simulation result of the impurity concentration at a time of simulating the normal on-state in the element B shown in FIG. 11. It is recognized that in the element B, the expansion of the depletion layer into the low concentration source resistance control region 15a is decreased. As described above, the high concentration source resistance control region 15b has an effect of suppressing the narrowing of the current pathway in the normal on-state and also suppressing the excessive increase in the on-resistance.

Figure 16:
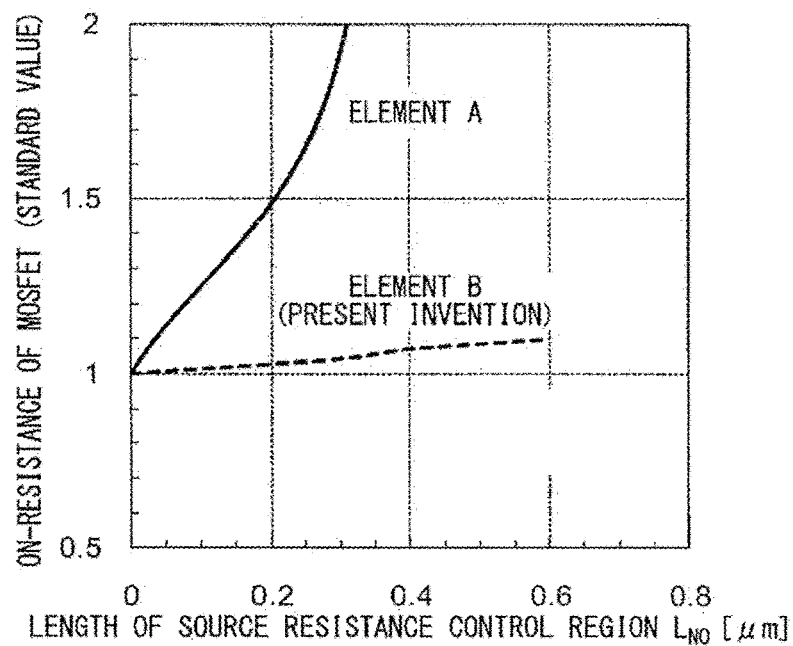
FIG. 16 A graph showing a relationship between a length of the source resistance control region and an on-resistance in the semiconductor device according to the embodiment 1.

The present inventor actually made the experimental element A and element B (the silicon carbide MOSFET) having the impurity concentration distribution shown in FIG. 11 to measure a relationship between the length of the source resistance control region 15 and the on-resistance in the normal on-state. FIG. 16 shows a graph indicating its measurement result. In the element A, the current pathway is narrowed even in the normal on-state, so that when the length of the source resistance control region is increased, the on-resistance drastically increases. In contrast, it is confirmed that in the element B, the narrowing of the current pathway is suppressed, so that the dependence of the on-resistance on the length of the source resistance control region 15 is moderated.

Figure 17:
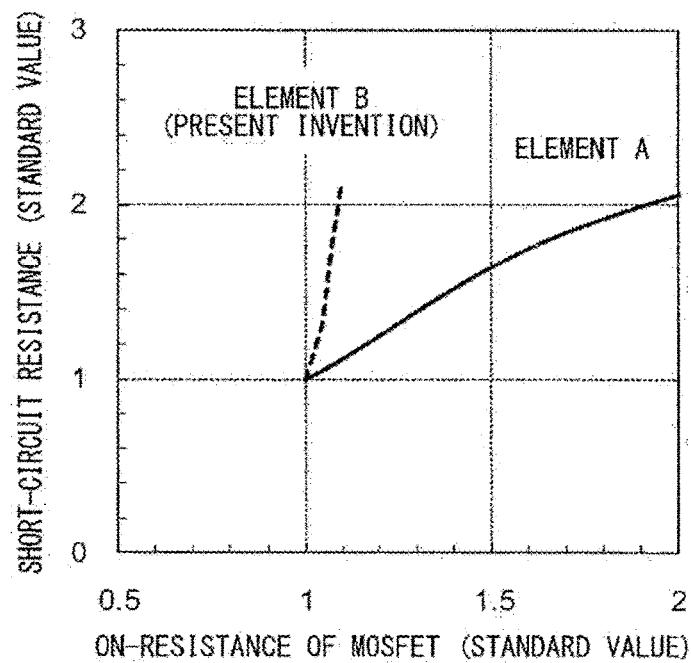
FIG. 17 A graph showing a relationship between the on-resistance and a short-circuit resistance in the semiconductor device according to the embodiment 1.

The present inventor further measured a relationship between the on-resistance in the experimental element A and element B and the short-circuit resistance. FIG. 17 shows a graph indicating its measurement result. When the on-resistance increases, the short-circuit resistance increases by reason that the effective gate voltage is made small due to the voltage drop generated in the source resistance control region 15, however, in the element A, the on-resistance increases even in the normal on-state, so that a trade-off between the short-circuit resistance and the on-resistance is not sufficiently improved. In contrast, in the element B, the increase in the on-resistance in the normal on-state is controlled, so that it is confirmed that the trade-off between the short-circuit resistance and the on-resistance is sufficiently improved compared with the element A.

Embodiment 2

Figure 18:
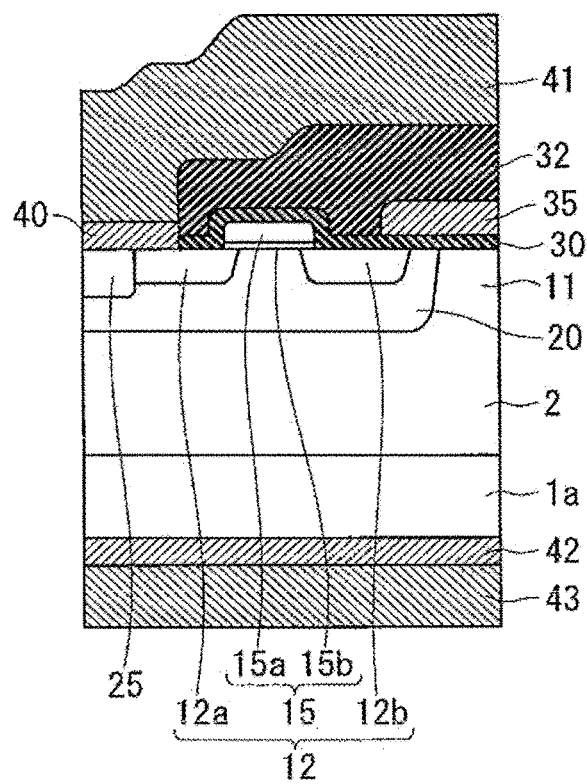
FIG. 18 A longitudinal sectional view showing a configuration of a semiconductor device according to an embodiment 2.

FIG. 18 is a longitudinal sectional view schematically showing a configuration of a semiconductor device (MOSFET) according to an embodiment 2. In FIG. 18, the components having the similar function as those shown in FIG. 1 are denoted by the same reference signs, so that the description of those components is omitted here.

The source region 12 is made up of the source contact region 12a, a source extension region 12b, and the source resistance control region 15 located between the source contact region 12a and the source extension region 12b also in the MOSFET according to the embodiment 2. The source resistance control region 15 is made up of the low concentration source resistance control region 15a and the high concentration source resistance control region 15b. However, as shown in FIG. 18, the source resistance control region 15 is formed not inside the drift layer 2 but on the surface of the drift layer 2.

A method of manufacturing a semiconductor device (MOSFET) according to the embodiment 2 is described hereinafter.

Firstly, the drift layer 2 is formed on the semiconductor substrate 1a, and the well region 20, the source contact region 12a, and the source extension region 12b are formed on the drift layer 2 by the method similar to the processing described in the embodiment 1 using FIGS. 4 and 5. Subsequently, the well contact region 25 is formed by the method similar to the processing described using FIG. 7.

Subsequently, the thermal treatment of electrically activating the impurity implanted into the drift layer 2 is performed. The thermal treatment is preferably performed in the inactive gas atmosphere such as argon or nitrogen, for example, or in vacuum at a temperature of 1500° C. to 2200° C. for 0.5 to 60 minutes.

Next, the first conductivity type silicon carbide is epitaxially grown on the drift layer 2 to form the epitaxial growth layer as the material of the high concentration source resistance control region 15b. A thickness of the epitaxial growth layer needs to be 0.05 μm to 0.5 μm, and the first conductivity type impurity concentration is set to approximately $1\times10^{17}$ cm$^{-3}$ to $1\times10^{20}$ cm$^{-3}$, for example.

The thickness and impurity concentration of the high concentration source resistance control region 15b may be set so that the whole thickness of the high concentration source resistance control region 15b is depleted by the depletion layer formed by the p-n junction between the high concentration source resistance control region 15b and the well region 20, or may also be set so that the whole thickness of the high concentration source resistance control region 15b is not completely depleted.

As described in the embodiment 1, when the thickness (the length in the depth direction) of the high concentration source resistance control region 15b is approximately equal to or smaller than the depth of the depletion layer in the p-n junction between the high concentration source resistance control region 15b and the well region 20, the expansion of the depletion layer into the low concentration source resistance control region 15a is restricted in the normal on-state, and the increase in the on-resistance of the MOSFET is suppressed.

When the thickness of the high concentration source resistance control region 15b is larger than the thickness of the depletion layer in the p-n junction between the high concentration source resistance control region 15b and the well region 20, the source resistance control region 15 having the large resistance modulation at the time of the short-circuit can be formed. In the above case, it is not necessary to form the low concentration source resistance control region 15a on the high concentration source resistance control region 15b.

When the impurity concentration of the high concentration source resistance control region 15b is increased to form the source resistance control region 15 having the large resistance modulation effect at the time of the load short-circuit, the impurity concentration of the well region 20 which contacts the high concentration source resistance control region 15b is preferably as high as possible. However, too high second conductivity type impurity concentration of the surface of the semiconductor substrate 1a has the influence on the element characteristics such as the on-resistance or the threshold voltage, for example, of the MOSFET, so that the appropriate concentration setting is necessary.

Next, the first conductivity type silicon carbide is further epitaxially grown on the epitaxial growth layer as the material of the high concentration source resistance control region 15b to form the epitaxial growth layer as the material of the low concentration source resistance control region 15a. A thickness of this epitaxial growth layer needs to be approximately 0.05 µm to 1.0 µm, and the first conductivity type impurity concentration is set to approximately $1\times10^{13}$ cm$^{-3}$ to $1\times10$ cm$^{-3}$, for example.

When the impurity concentration and thickness of the high concentration source resistance control region 15b is adjusted, the impurity concentration of the low concentration source resistance control region can be decreased to a desired range.

Figure 19:
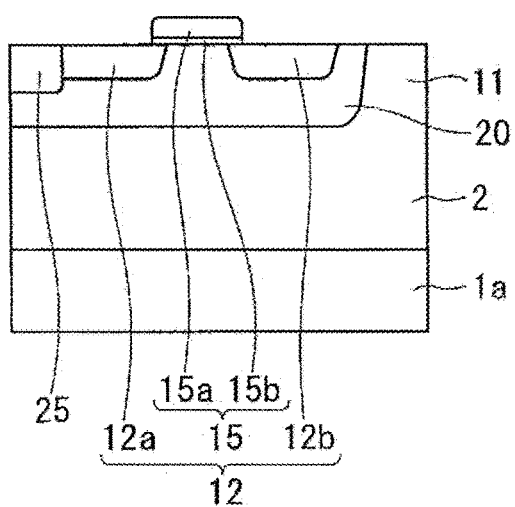
FIG. 19 A longitudinal sectional view for describing a method of manufacturing the semiconductor device according to the embodiment 2.

Subsequently, the patterning is performed on the above two epitaxial growth layers by the etching using the resist mask processed by a photoengraving processing, and the source resistance control region 15 made up of the low concentration source resistance control region 15a and the high concentration source resistance control region 15b is formed (FIG. 19). Herein, described is the example of forming the source resistance control region 15 using the two epitaxial growth layers whose impurity concentrations are different from each other, however, the source resistance control region 15 may also be formed using three or more epitaxial growth layers.

As shown in FIG. 19, the source resistance control region 15 is disposed across the source contact region 12a and the source extension region 12b and located between them so as to achieve the series connection. That is to say, the source resistance control region 15 overlaps and contacts each of the source contact region 12a and the source extension region 12b to form the current pathway as the part of the source region 12.

Subsequently, the gate insulating film 30 and the gate electrode 35 are formed by the method similar to the embodiment 1, and the interlayer insulating film 32, the ohmic electrodes 40 and 42, the source electrode 41, and the drain electrode 43 are further formed, so that the configuration of the MOSFET shown in FIG. 18 is completed.

A mobility of a conduction carrier of the source resistance control region 15 is controlled by a lattice scattering in a room temperature or higher, and the mobility of the conduction carrier decreases as the temperature rises. When there is a crystal defect in the source resistance control region 15 due to a process such as the ion implantation, a trap formed in an energy level of a certain degree catches the conduction carrier, so that the effective mobility decreases. The mobility of the caught conduction carrier gets close to the mobility in a state where there is no trap by reason that a heat is released from the trap when the temperature of the conduction carrier rises to a certain degree. Accordingly, a difference between the mobility around the room temperature and the mobility under high temperature becomes larger as the amount of the crystal defect decreases. In the above case, the source resistance control region 15 has the resistance having a high temperature sensibility which has less influence on the on-resistance in the room temperature and indicates a large resistance under the high temperature at the time of the short-circuit.

According to the present embodiment, the source resistance control region 15 having the high temperature sensitivity can be obtained by using the high-quality epitaxial growth layer which has no implantation defect and thereby has a low defect density as the material of the source resistance control region 15.

FIG. 20 is a longitudinal sectional view showing a modification example of the semiconductor device according to the embodiment 2. In the configuration of FIG. 20, the epitaxial growth layer which constitutes the low concentration source resistance control region 15a is caused to extend to an upper part of the channel region and the JFET region 11, so that a part of the epitaxial growth layer functions as the channel region. The semiconductor device which includes the high-quality epitaxial growth layer having the low defect density as the channel region can be obtained.

The above configuration can be formed by separately performing the patterning of the low concentration source resistance control region 15a and the patterning of the high concentration source resistance control region 15b. That is to say, it is applicable to form the epitaxial growth layer as the material of the low concentration source resistance control region 15a after performing the patterning of the high concentration source resistance control region 15b, and then perform the patterning of the low concentration source resistance control region 15a. At this time, as show in FIG. 21, the epitaxial growth layer which constitutes the low concentration source resistance control region 15a is also caused to remain on the channel region and the JFET region 11.

Figure 22:
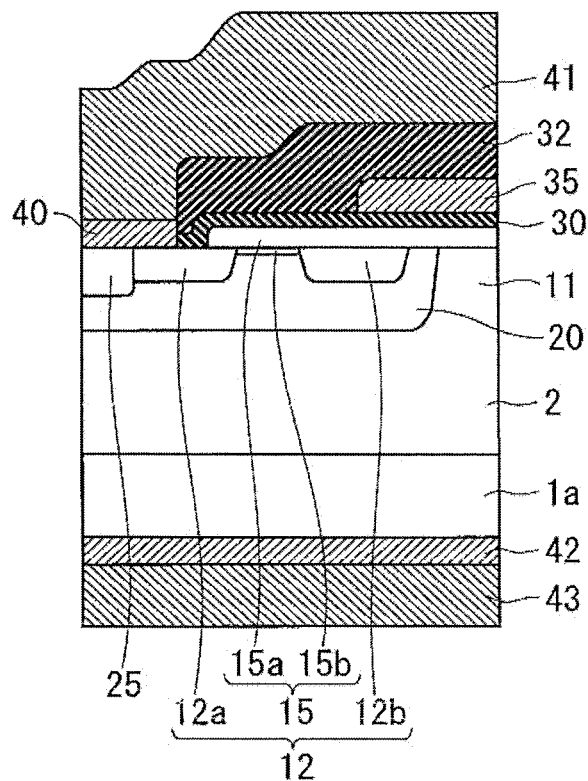
FIG. 22 A longitudinal sectional view showing a modification example of the semiconductor device according to the embodiment 2.

FIG. 22 is a longitudinal sectional view showing another modification example of the semiconductor device according to the embodiment 2. In FIG. 22, in the low concentration source resistance control region 15a and the high concentration source resistance control region 15b, the high concentration source resistance control region 15b is formed on a surface layer part of the drift layer 2, and the low concentration source resistance control region 15a is formed on the surface of the well region 20.

Figure 23:
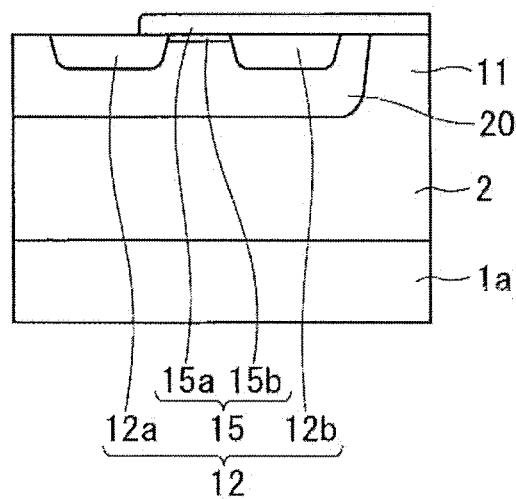
FIG. 23 A longitudinal sectional view for describing the method of manufacturing the semiconductor device of FIG. 22.

The above configuration can be formed by forming the high concentration source resistance control region 15b by performing the ion implantation on the drift layer 2 and subsequently, as shown in FIG. 23, performing the patterning on the epitaxial growth layer formed on the drift layer 2 to form the low concentration source resistance control region 15a. According to the above forming method, obtained is an advantage that the high alignment accuracy is not required when the high concentration source resistance control region 15b is formed.

The MOSFET including the source resistance control region 15 which is made up of the epitaxial growth layer described in the embodiment 2 also has the configuration of the IGBT by using the second conductivity type semiconductor substrate 1b (FIG. 10) instead of the first conductivity type semiconductor substrate 1a. That is to say, the embodiment 2 can also be applied to the IGBT.

Embodiment 3

Figure 27:
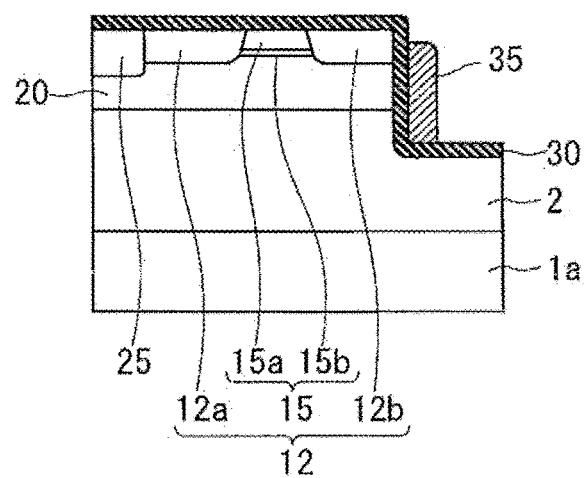
FIG. 27 A longitudinal sectional view showing a modification example of the semiconductor device according to the embodiment 3.
Figure 28:
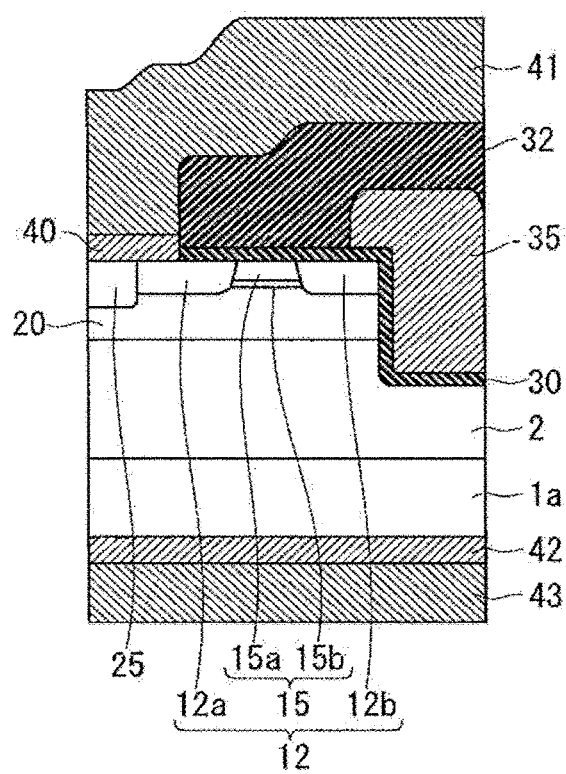
FIG. 28 A longitudinal sectional view showing a configuration of the semiconductor device according to the embodiment 3.
Figure 29:
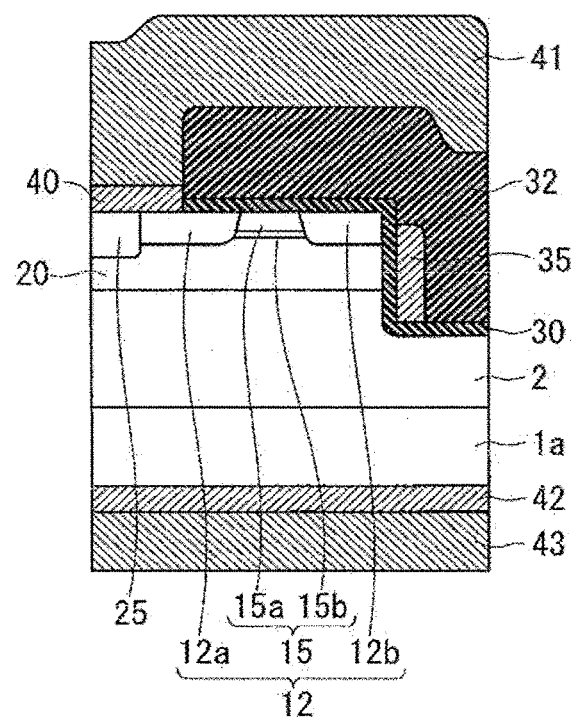
FIG. 29 A longitudinal sectional view showing a modification example of the semiconductor device according to the embodiment 3.

In the embodiment 3, the present invention is applied to a trench type MOSFET. FIGS. 24 to 29 are process drawings showing a method of manufacturing a trench type silicon carbide MOSFET which is the semiconductor device according to the present embodiment (FIG. 28 and FIG. 29 show the configuration of the completed MOSFET).

The method of manufacturing the silicon carbide MOSFET according to the embodiment 3 is described hereinafter.

Figure 24:
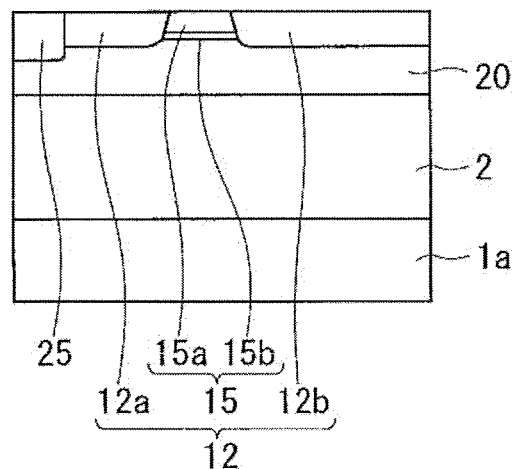
FIG. 24 A longitudinal sectional view showing a method of manufacturing a semiconductor device according to an embodiment 3.

Firstly, the drift layer 2 is formed on the semiconductor substrate 1a, and the well region 20, the source region 12 which is made up of the source contact region 12a, the source extension region 12b, and the source resistance control region 15, and the well contact region 25 are formed on the drift layer 2 by the method similar to the processing described in the embodiment 1 using FIGS. 4 to 7. Herein, the well region 20 and the source extension region 12b may be connected to each other between the adjacent unit cells (that is to say, the JFET region 11 needs not be formed). In the above case, a structure shown in FIG. 24 is obtained.

Figure 25:
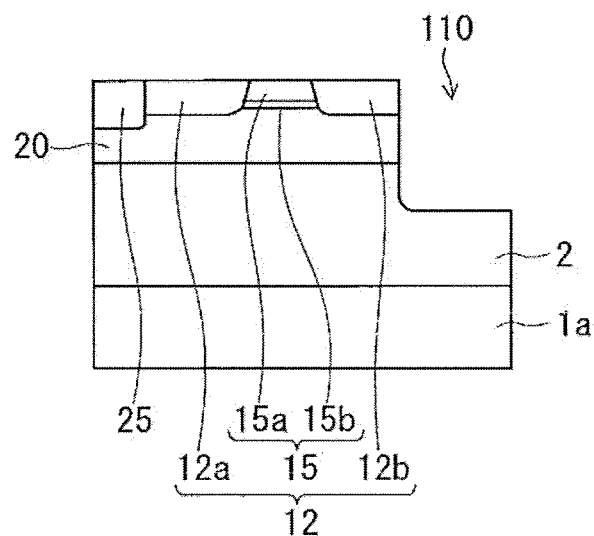
FIG. 25 A longitudinal sectional view showing a method of manufacturing the semiconductor device according to the embodiment 3.

Next, a trench 110 shown in FIG. 25 is formed in a region between the unit cells by performing a selective etching. The trench 110 is formed to be in contact with the well region 20 and the source extension region 12b and deeper than the bottom of the well region 20. The source extension region 12b and the well region 20 are exposed side by side in a vertical direction (a direction perpendicular to the surface of the drift layer 2, that is to say, a depth direction of the trench 110) from a sidewall of the trench 110.

A shape of a corner part of the trench 110 preferably has a taper shape or a round shape so that an electric field concentration at a time of operation of the MOSFET is reduced. It is preferable that the sidewall of the trench 110 is substantially perpendicular to the surface of the drift layer 2.

Subsequently, after cleaning a sidewall surface of the trench 110 by a sacrificial oxidation method and a CDE (Chemical Dry Etching), for example, the gate insulating film 30 and the gate electrode 35 are formed by the method similar to the embodiment 1.

Figure 26:
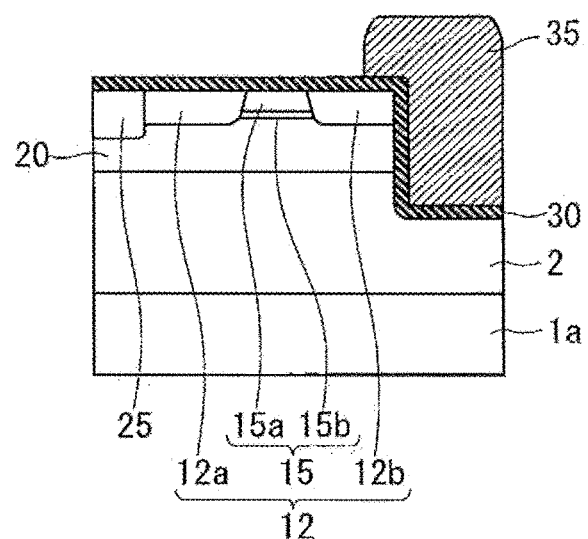
FIG. 26 A longitudinal sectional view showing a method of manufacturing the semiconductor device according to the embodiment 3.

As shown in FIG. 26, the gate insulating film 30 is formed on the surface of the drift layer 2 including an inside of the trench 110. The gate electrode 35, at least part of which is embedded in the trench 110, is provided to be adjacent to the source extension region 12b, the well region 20, and the drift layer 2 which are exposed from the sidewall of the trench 110 with the gate insulating film 30 therebetween. That is to say, the gate electrode 35 extends across the source extension region 12b, the well region 20, and the drift layer 2 which are exposed from the sidewall of the trench 110. In the above case, part of the well region 20 which is sandwiched between the drift layer 2 located below the well region 20 and the source extension region 12b and further adjacent to the trench 110 becomes the channel region of the MOSFET.

When the end part of the gate electrode 35 in the horizontal direction is located outside the trench 110 at the time of patterning the gate electrode 35, the part of the gate electrode 35 is embedded in the trench 110 as shown in FIG. 26. In contrast, as shown in FIG. 27, the gate electrode 35 may remain only in the inside (the sidewall part) of the trench 110, and the whole gate electrode 35 may be embedded in the trench 110.

After forming the gate electrode 35, the interlayer insulating film 32, the ohmic electrode 40, and the source electrode 41 are formed by the steps similar to the embodiment 1. Accordingly, the trench type MOSFET having the configuration shown in FIG. 28 is obtained. When the gate electrode 35 has the shape shown in FIG. 27, the silicon carbide MOSFET has the configuration shown in FIG. 29.

When the width of the gate electrode 35 is increased as shown in FIG. 28, an advantage that the resistance value of the gate electrode 35 can be sufficiently reduced, however, a high electric field easily occurs in an edge part of the trench 110 and the part of the MOS structure in a bottom of the trench 110.

In contrast, when the gate electrode 35 is formed only on the sidewall of the trench 110 as shown in FIG. 29, the above problem regarding the high electric field can be prevented, and moreover, the gate electrode 35 can be formed by a self-aligned process (a framed etching), so that a cost reduction caused by the reduction in a total number of masks can also be achieved. In FIG. 29, the gate electrode 35 is formed to be adjacent to the source extension region 12b (overlap the source extension region 12b in the horizontal direction) with the gate insulating film 30 therebetween, and this configuration is important from a viewpoint of preventing the increase in the channel resistance of the MOSFET.

As described above, the present invention is also applicable to the trench type MOSFET. In the above case, also, the source resistance control region 15, which is formed by the processing different from that of the source contact region 12a and the source extension region 12b, is inserted in series into a pathway from the channel region of the well region 20 to the ohmic electrode 40 and the source electrode 41, so that an effective source resistance can be changed by changing the impurity concentration of the source resistance control region 15, and the effect similar to the embodiment 1 can be obtained. In particular, the trench type MOSFET has the structure not including the JFET region 11, so that the saturation current cannot be controlled by a JFET effect, however, the saturation current control performed by controlling the source resistance can be achieved by applying the present invention.

In the similar manner to the embodiment 1, the source resistance control region 15 is made up of the low concentration source resistance control region 15a and the high concentration source resistance control region 15b. As described in the embodiment 1, when the thickness (the length in the depth direction) of the high concentration source resistance control region 15b is approximately equal to or smaller than the depth of the depletion layer in the p-n junction between the high concentration source resistance control region 15b and the well region 20, the expansion of the depletion layer into the low concentration source resistance control region 15a is restricted in the normal on-state, and the increase in the on-resistance of the MOSFET is suppressed. In contrast, when the thickness of the high concentration source resistance control region 15b is larger than the thickness of the depletion layer in the p-n junction between the high concentration source resistance control region 15b and the well region 20, the source resistance control region 15 having the large resistance modulation at the time of the short-circuit can be formed.

The above description describes the example of applying the source region 12 having the configuration described in the embodiment 1 to the trench type MOSFET, however, as shown in FIG. 30, the source region 12 having the configuration described in the embodiment 2 is also applicable.

The configuration of FIG. 30 can be achieved by forming the low concentration source resistance control region 15a and the high concentration source resistance control region 15b which constitute the source resistance control region 15 using the epitaxial growth layer grown on the surface of the drift layer 2 as shown in FIG. 31 in a similar manner to the embodiment 2. In the above case, the trench type MOSFET provided with the source resistance control region 15 which does not have implantation defect but has the low defect density and the high temperature sensitivity can be achieved.

Embodiment 4

In the embodiment 4, the present invention is applied to the trench type MOSFET in a similar manner to the embodiment 3, however, the source region 12 has a laminated structure in which the source contact region 12a, the source resistance control region 15, and the source extension region 12b are arranged in the vertical direction (the direction perpendicular to the surface of the drift layer 2).

Figure 32:
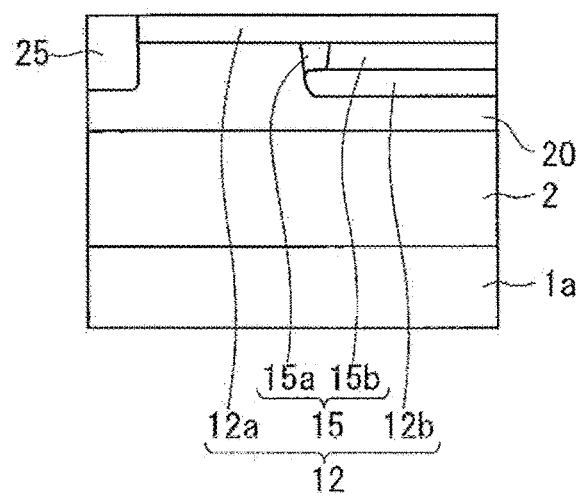
FIG. 32 A longitudinal sectional view showing a method of manufacturing a semiconductor device according to an embodiment 4.
Figure 33:
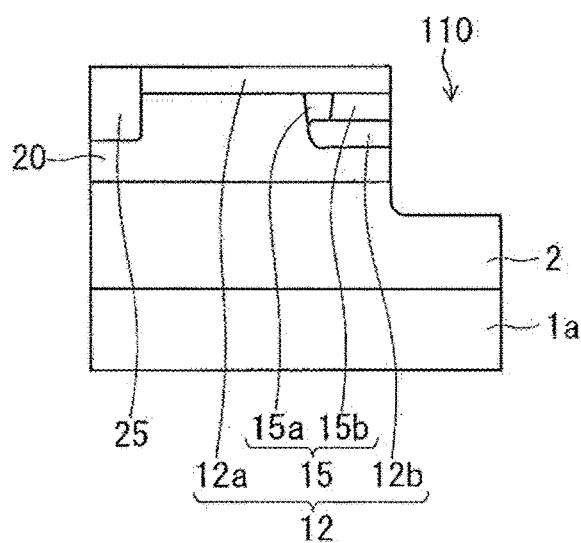
FIG. 33 A longitudinal sectional view showing a method of manufacturing the semiconductor device according to the embodiment 4.
Figure 34:
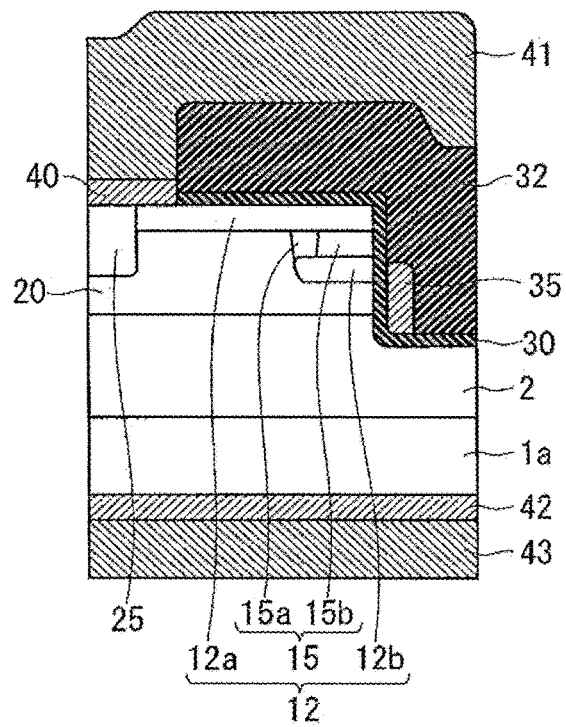
FIG. 34 A longitudinal sectional view showing a configuration of the semiconductor device according to the embodiment 4.

FIGS. 32 to 34 are process drawings showing a method of manufacturing a trench type silicon carbide MOSFET which is the semiconductor device according to the present embodiment (FIG. 34 shows the configuration of the completed MOSFET).

The method of manufacturing the silicon carbide MOSFET according to the embodiment 4 is described hereinafter.

Firstly, the second conductivity type well region 20 is formed on the drift layer 2 after forming the drift layer 2 on the semiconductor substrate 1a. The well region 20 may be formed by ion-implanting the second conductivity type impurity on an upper layer part of the drift layer 2, or may also be formed by epitaxially growing the second conductivity type semiconductor on the drift layer 2.

Subsequently, the first conductivity type impurity is ion-implanted to form the source contact region 12a, the source resistance control region 15, and the source extension region 12b in a desired depth, and the second conductivity type impurity is further ion-implanted to form the well contact region 25 (FIG. 32). As shown in FIG. 32, the source resistance control region 15 has the configuration of including the low concentration source resistance control region 15a and the high concentration source resistance control region 15b, and the high concentration source resistance control region 15b is formed between the low concentration source resistance control region 15a and the well region 20.

In the present embodiment, the source contact region 12a is formed on an upper side of the source resistance control region 15, and the source extension region 12b is formed on a lower side of the source resistance control region 15, so that the source resistance control region 15 is in contact with the well region 20 in the horizontal direction. Accordingly, the source resistance control region 15 has the configuration in which the low concentration source resistance control region 15a and the high concentration source resistance control region 15b are arranged in the horizontal direction. That is to say, in the present embodiment, the horizontal direction is defined as the depth direction of the source resistance control region 15, and a distance between the source contact region 12a and the source extension region 12b in the vertical direction is defined as the length of the source resistance control region 15.

After forming the well region 20, the source region 12, and the well contact region 25, the trench 110 is formed as shown in FIG. 33 by the method similar to the embodiment 3. Herein, the trench 110 is formed to pass through the source region 12 and the well region 20 to reach the drift layer 2 below the well region 20. Since the source region 12 has the structure in which the source contact region 12a, the source resistance control region 15, and the source extension region 12b are laminated in the vertical direction, all of them reach the sidewall of the trench 110. In the similar manner to the embodiment 3, the channel region of the MOSFET is sandwiched between the drift layer 2 located below the well region 20 and the source extension region 12b and becomes the part of the well region 20 adjacent to the trench 110.

Furthermore, the gate insulating film 30 and the gate electrode 35 are formed by the method similar to the embodiment 3. In the present embodiment, the gate electrode 35 is formed by a frame etching, for example, and the whole gate electrode 35 is embedded in the trench 110. The gate electrode 35 does not overlap the source resistance control region 15 and the source extension region 12b but overlaps the source extension region 12b among the source contact region 12a, the source resistance control region 15, and the source extension region 12b, which constitute the source region 12 (refer to FIG. 34). That is to say, the gate electrode 35 extends across the source extension region 12b, the well region 20, and the drift layer 2.

The increase in the channel resistance of the MOSFET can be prevented by causing the gate electrode 35 to overlap the source extension region 12b. Moreover, since the gate electrode 35 does not overlap the source resistance control region 15, it is possible not to cause the effect of the present invention according to the source resistance control region 15 to depend on a gate bias.

Subsequently, the interlayer insulating film 32, the ohmic electrode 40, and the source electrode 41 are formed by the method similar to the embodiment 1, so that the trench type MOSFET having the configuration shown in FIG. 34 is obtained.

According to the semiconductor device according to the embodiment 4, the source extension region 12b, the source resistance control region 15, and the source contact region 12a are arranged in the vertical direction, so that a cell pitch of the unit cell in the horizontal direction can be reduced, and the on-resistance of the element can be reduced by increasing a channel density.

In the similar manner to the embodiment 1, the source resistance control region 15 is made up of the low concentration source resistance control region 15a and the high concentration source resistance control region 15b. As described in the embodiment 1, when the thickness (the length in the depth direction) of the high concentration source resistance control region 15b is approximately equal to or smaller than the depth of the depletion layer in the p-n junction between the high concentration source resistance control region 15b and the well region 20, the expansion of the depletion layer into the low concentration source resistance control region 15a is restricted in the normal on-state, and the increase in the on-resistance of the MOSFET is suppressed. In contrast, when the thickness of the high concentration source resistance control region 15b is larger than the thickness of the depletion layer in the p-n junction between the high concentration source resistance control region 15b and the well region 20, the source resistance control region 15 having the large resistance modulation at the time of the short-circuit can be formed.

The trench type MOSFET described in the embodiments 3 and 4 also has the configuration of the IGBT by using the second conductivity type semiconductor substrate 1b (FIG. 10) instead of the first conductivity type semiconductor substrate 1a. That is to say, the embodiments 3 and 4 can also be applied to the IGBT.

Embodiment 5

In the embodiment 5, the present invention is applied to a MOSFET into which a Schottky barrier diode (SBD; also referred to "the Schottky diode" hereinafter) is built (the MOSFET with the built-in SBD).

Figure 35:
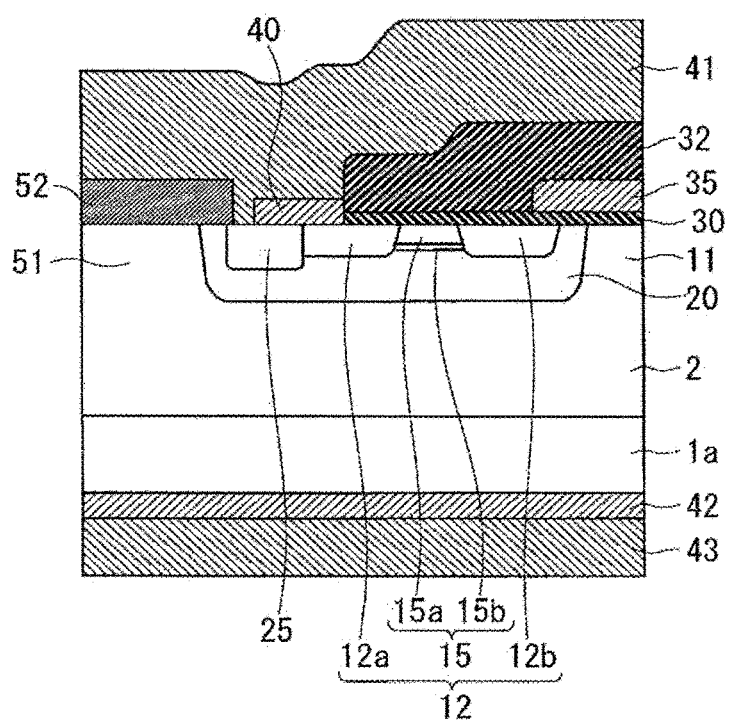
FIG. 35 A longitudinal sectional view showing a configuration of a semiconductor device according to an embodiment 5.

FIG. 35 is a longitudinal sectional view showing a configuration of the MOSFET with the built-in SBD which is the semiconductor device according to the embodiment 5. The semiconductor device has a structure in which the Schottky diode and the MOSFET similar to that of the embodiment 1 are arranged side by side with the well contact region 25 therebetween. That is to say, with respect to the well contact region 25, the source region 12 of the MOSFET is formed on one side (on a right side in FIG. 35; also referred to as "the MOSFET side"), and the source region 12 is not formed on an opposite side of the substrate in the horizontal direction (on a left side in FIG. 35; also referred to as "the SBD side") but an n-type (the first conductivity type) Schottky diode forming region 51 is formed to be adjacent to the well region 20. The Schottky diode forming region 51, which is a region having the same conductivity type with the drift layer 2, is provided between the well region 20, and is defined as a region from the surface of the drift layer 2 to a region located in the same depth as that of the well region 20.

A Schottky electrode 52 connected to the Schottky diode forming region 51 is formed on the drift layer 2. The Schottky electrode 52 and the silicon carbide of the Schottky diode forming region 51 is Schottky-connected to constitute the Schottky barrier diode. The Schottky electrode 52 is electrically connected to the source electrode 41 of the MOSFET.

Figure 36:
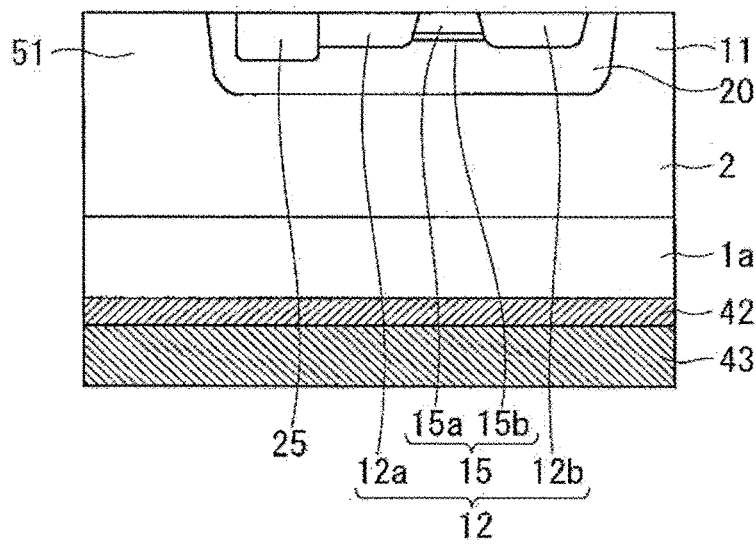
FIG. 36 A longitudinal sectional view showing a method of manufacturing the semiconductor device according to the embodiment 5.
Figure 37:
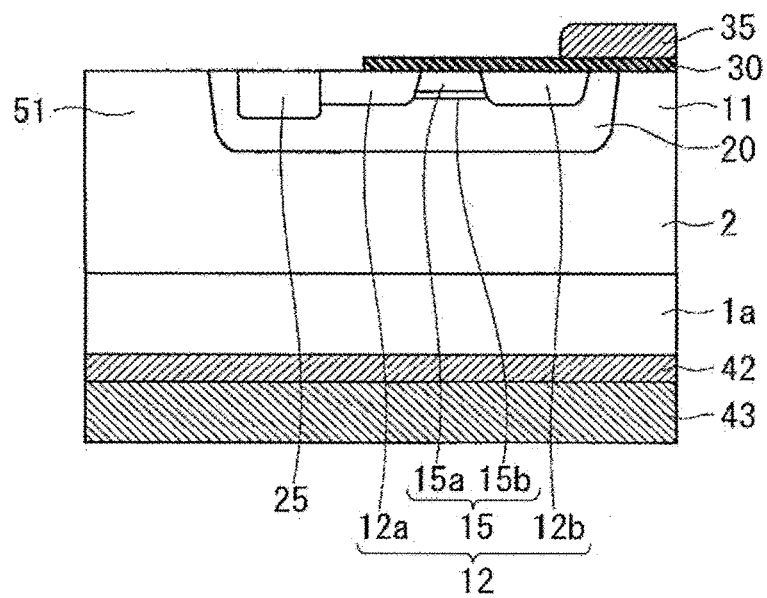
FIG. 37 A longitudinal sectional view showing a method of manufacturing the semiconductor device according to the embodiment 5.

FIGS. 36 and 37 are process drawings showing a method of manufacturing the MOSFET with the built-in SBD which is the semiconductor device according to the present embodiment.

The method of manufacturing the MOSFET with the built-in SBD according to the embodiment 5 is described hereinafter.

Firstly, in a similar manner as the embodiment 1, the second conductivity type well region 20 is formed on the surface layer part of the drift layer 2 after forming the drift layer 2 on the semiconductor substrate 1a. At this time, an n-type region as the Schottky diode forming region 51 is secured together with an n-type region which becomes the JFET region 11 between the well region 20. The well region 20 may be formed by ion-implanting the second conductivity type impurity on the upper layer part of the drift layer 2, or may also be formed by epitaxially growing the second conductivity type semiconductor on the drift layer 2.

Subsequently, the first conductivity type impurity is ion-implanted to form the source region 12 made up of the source contact region 12a, the source resistance control region 15, and the source extension region 12b in the well region 20, and the second conductivity type impurity is further ion-implanted to form the well contact region 25 (FIG. 36). As shown in FIG. 36, the source resistance control region 15 has the configuration of including the low concentration source resistance control region 15a and the high concentration source resistance control region 15b, and the high concentration source resistance control region 15b is formed between the low concentration source resistance control region 15a and the well region 20. The source region 12 is formed on the one side (the MOSFET side) of the well contact region 25, and is not formed on the opposite side (the SBD side) of the well contact region 25.

Subsequently, the gate insulating film 30 and the gate electrode 35 are formed by the method similar to the embodiment 1 (FIG. 37). As shown in FIG. 37, the gate electrode 35 is formed on the one side (the MOSFET side) of the well contact region 25, and is not formed on the opposite side (the SBD side) of the well contact region 25.

Furthermore, the interlayer insulating film 32 and the ohmic electrodes 40 and 42 are formed by the method similar to the embodiment 1, and subsequently, the Schottky electrode 52 is formed on the Schottky diode forming region 51. Subsequently, the source electrode 41 and the drain electrode 43 are formed. At this time, the source electrode 41 is formed to be connected to the Schottky electrode 52. According to the above processing, the configuration of the MOSFET with the built-in SBD shown in FIG. 35 is completed.

In the embodiment 5, the source resistance control region 15 is provided in the source region 12 of the MOSFET with the built-in SBD. According to the above configuration, the Schottky diode made up of the Schottky diode forming region 51 and the Schottky electrode 52 is rendered ON before the body diode built into the MOSFET is operated, so that the increase in the on-resistance of the MOSFET and a deterioration of a withstanding voltage due to an expansion of the crystal defect can be suppressed. Moreover, an external diode chip becomes unnecessary due to the built-in Schottky diode, so that a cost reduction can be achieved. Furthermore, a merit that the short-circuit resistance is enhanced by the source resistance control region 15 can also be obtained.

In the similar manner to the embodiment 1, the source resistance control region 15 is made up of the low concentration source resistance control region 15a and the high concentration source resistance control region 15b. As described in the embodiment 1, when the thickness (the length in the depth direction) of the high concentration source resistance control region 15b is approximately equal to or smaller than the depth of the depletion layer in the p-n junction between the high concentration source resistance control region 15b and the well region 20, the expansion of the depletion layer into the low concentration source resistance control region 15a is restricted in the normal on-state, and the increase in the on-resistance of the MOSFET is suppressed. In contrast, when the thickness of the high concentration source resistance control region 15b is larger than the thickness of the depletion layer in the p-n junction between the high concentration source resistance control region 15b and the well region 20, the source resistance control region 15 having the large resistance modulation at the time of the short-circuit can be formed.

Described above is an example that the Schottky diode is built into the MOSFET of the embodiment 1, however, the Schottky diode of the present embodiment can also be applied to the MOSFET of the embodiment 2. The MOSFET with the built-in SBD described in the embodiment 5 also has the configuration of the IGBT by using the second conductivity type semiconductor substrate 1b (FIG. 10) instead of the first conductivity type semiconductor substrate 1a. That is to say, the embodiment 5 can also be applied to the IGBT.

Embodiment 6

In the embodiment 6, the present invention is applied to a trench type MOSFET with a built-in Schottky barrier diode (the trench MOSFET with the built-in SBD).

Figure 38:
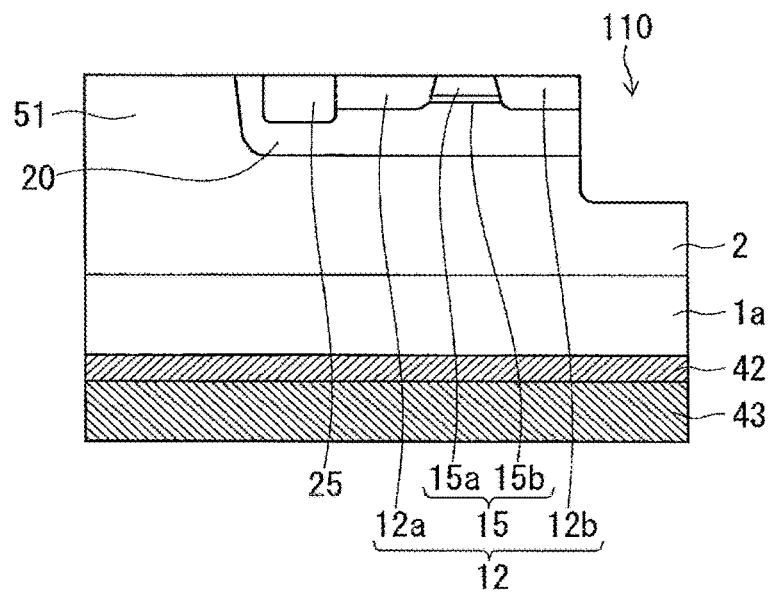
FIG. 38 A longitudinal sectional view showing a method of manufacturing a semiconductor device according to an embodiment 6.
Figure 39:
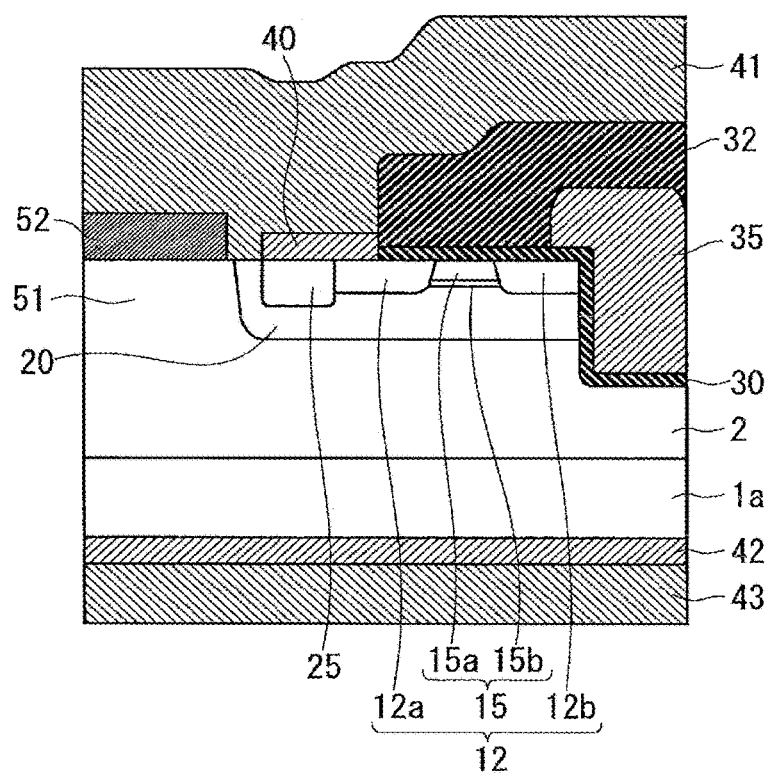
FIG. 39 A longitudinal sectional view showing a configuration of the semiconductor device according to the embodiment 6.

FIGS. 38 to 40 are process drawings showing a method of manufacturing the MOSFET with the built-in SBD which is the semiconductor device according to the present embodiment (FIG. 39 and FIG. 40 show the configuration of the completed trench MOSFET with the built-in SBD).

The method of manufacturing the trench MOSFET with the built-in SBD according to the embodiment 6 is described hereinafter.

Firstly, in a similar manner as the embodiment 2, the second conductivity type well region 20 is formed on the drift layer 2 after forming the drift layer 2 on the semiconductor substrate 1a. At this time, an n-type region as the Schottky diode forming region 51 is secured between the well region 20.

Next, the well region 20, the source region 12 which is made up of the source contact region 12a, the source extension region 12b, and the source resistance control region 15, and the well contact region 25 are formed on the drift layer 2 by the method similar to the processing described in the embodiment 1 using FIGS. 4 to 7. The source region 12 is formed on the one side (the MOSFET side) of the well contact region 25, and is not formed on the opposite side (the SBD side) of the well contact region 25. The source resistance control region 15 has the configuration of including the low concentration source resistance control region 15a and the high concentration source resistance control region 15b, and the high concentration source resistance control region 15b is formed between the low concentration source resistance control region 15a and the well region 20. The well region 20 and the source extension region 12b may be connected to each other between the adjacent unit cells (that is to say, the JFET region 11 needs not be formed).

Next, a trench 110 shown in FIG. 38 is formed in a region between the unit cells by performing a selective etching. The trench 110 is formed to be in contact with the well region 20 and the source extension region 12b and deeper than the bottom of the well region 20. The source extension region 12b and the well region 20 are exposed side by side in the vertical direction (the direction perpendicular to the surface of the drift layer 2, that is to say, the depth direction of the trench 110) from the sidewall of the trench 110.

Subsequently, the gate insulating film 30, the gate electrode 35, the interlayer insulating film 32, and the ohmic electrodes 40 and 42 are formed by the method similar to the embodiment 2. The gate insulating film 30 is formed on the surface of the drift layer 2 including the inside of the trench 110. The gate electrode 35, at least part of which is embedded in the trench 110, is provided to be adjacent to the source extension region 12b, the well region 20, and the drift layer 2 which are exposed from the sidewall of the trench 110 with the gate insulating film 30 therebetween.

Subsequently, the Schottky electrode 52 is formed on the Schottky diode forming region 51. Then, the source electrode 41 and the drain electrode 43 are formed. At this time, the source electrode 41 is formed to be connected to the Schottky electrode 52. According to the above processing, the trench type MOSFET with the built-in SBD having the configuration shown in FIG. 39 is obtained. The trench type MOSFET with the built-in SBD of FIG. 39 has a structure in which the Schottky diode and the trench type MOSFET similar to that of the embodiment 3 are arranged side by side with the well contact region 25 therebetween.

In the trench type MOSFET with the built-in SBD according to the embodiment 6, the Schottky diode is rendered ON before the body diode built into the MOSFET is operated, so that the increase in the on-resistance of the MOSFET and the deterioration of the withstanding voltage due to the expansion or the crystal defect can be suppressed. Moreover, the external diode chip becomes unnecessary due to the built-in Schottky diode, so that the cost reduction can be achieved. Furthermore, the merit that the short-circuit resistance is enhanced by the source resistance control region 15 can also be obtained. Since the channel of the MOSFET can be provided in the vertical direction, the width of the unit cell (the cell pitch) in the horizontal direction can be reduced, and a larger current can be flowed compared to the current in the same area. That is, to say, the on-resistance of the MOSFET can be reduced.

In the similar manner to the embodiment 2, the source resistance control region 15 is made up of the low concentration source resistance control region 15a and the high concentration source resistance control region 15b. As described in the embodiment 1, when the thickness (the length in the depth direction) of the high concentration source resistance control region 15b is approximately equal to or smaller than the depth of the depiction layer in the p-n junction between the high concentration source resistance control region 15b and the well region 20, the expansion of the depletion layer into the low concentration source resistance control, region 15a is restricted in the normal on-state, and the increase in the on-resistance of the MOSFET is suppressed. In contrast, when the thickness of the high concentration source resistance control region 15b is larger than the thickness of the depletion layer in the p-n junction between the high concentration source resistance control region 15b and the well region 20, the source resistance control region 15 having the large resistance modulation at the time of the short-circuit can be formed.

In contrast, as shown in FIG. 40, the gate electrode 35 may remain only in the inside (the sidewall part) of the trench 110, and the whole gate electrode 35 may be embedded in the trench 110. In the above case, as described in the embodiment 2, the effect of suppressing the electric field occurring in the edge part of the trench 110 and the part of the MOS structure in the bottom of the trench 110 is obtained.

Described above is an example that the Schottky diode is built into the trench type MOSFET of the embodiment 3, however, the Schottky diode of the present embodiment is also applicable to the trench type MOSFET of the embodiment 4. The trench type MOSFET with the built-in SBD described in the embodiment 6 also has the configuration of the IGBT by using the second conductivity type semiconductor substrate 1b (FIG. 10) instead of the first conductivity type semiconductor substrate 1a. That is to say, the embodiment 6 can also be applied to the IGBT.

The effects obtained from the structure of the semiconductor device described in the above embodiments 1 to 6 are similarly obtained even when the semiconductor device is formed by the other manufacturing method as long as it has the above structure. The above embodiments of the present invention can be appropriately modified, omitted, or freely combined within the scope of the invention.

The present invention has been shown and described in detail, the foregoing description is in all aspects illustrative and not restrictive. It is therefore understood that numerous modifications and variations can be devised without departing from the scope of the invention.

REFERENCE SIGNS LIST 1a, 1b semiconductor substrate, 1b semiconductor substrate, 2 drift layer, 10 unit cell, 11 JFET region, 12 source region, 12a source contact region, 12b source extension region, 15 source resistance control region, 15a low concentration source resistance control region, 15b high concentration source resistance control region, 20 well region, 25 well contact region, 30 gate insulating film, 40, 42 ohmic electrode, 41 source electrode, 43 drain electrode, 51 Schottky diode forming region, 52 Schottky electrode, 100a, 100b, 100c implantation mask 100c.

The invention claimed is:
1. A semiconductor device, comprising:
a semiconductor substrate;
a first conductivity type drift layer formed on said semiconductor substrate;
a second conductivity type well region selectively formed on a surface layer part of said drift layer;
a first conductivity type source region formed on a surface layer part in said well region;
a JFET region which is a part of said drift layer adjacent to said well region;

a channel region which is a part of said well region sandwiched between said source region and said JFET region;
a gate electrode provided on said drift layer with a gate insulating film therebetween to extend across said source region, said channel region, and said JFET region;
a source electrode connected to said source region; and
a drain electrode formed on a back surface of said semiconductor substrate, wherein
said source region includes:
a source contact region formed on said surface layer part in said well region and connected to said source electrode;
a source extension region formed on said surface layer part in said well region and adjacent to said channel region; and
a source resistance control region provided between said source extension region and said source contact region, and
said source resistance control region includes:
a low concentration source resistance control region whose first conductivity type impurity concentration is lower than that of said source extension region or said source contact region; and
a high concentration source resistance control region which is formed between said well region and said low concentration source resistance control region and whose first conductivity type impurity concentration is higher than that of said low concentration source resistance control region.

2. A semiconductor device, comprising:
a semiconductor substrate;
a first conductivity type drift layer formed on said semiconductor substrate;
a second conductivity type well region selectively formed on a surface layer part of said drift layer;
a trench formed to pass through said well region to reach said drift layer;
a first conductivity type source region formed on a surface layer part in said well region to reach a sidewall of said trench;
a channel region which is a part of said well region sandwiched between said source region and said drift layer located below said well region and also adjacent to said trench;
a gate electrode provided in said trench with a gate insulating film therebetween to extend across said source region, said channel region, and said drift layer located below said well region;
a source electrode connected to said source region; and
a drain electrode formed on a back surface of said semiconductor substrate, wherein
said source region includes:
a source contact region formed on said surface layer part in said well region and connected to said source electrode;
a source extension region adjacent to said channel region; and
a source resistance control region provided between said source extension region and said source contact region, and
said source resistance control region includes:
a low concentration source resistance control region whose first conductivity type impurity concentration is lower than that of said source extension region or said source contact region; and
a high concentration source resistance control region which is formed between said well region and said low concentration source resistance control region and whose first conductivity type impurity concentration is higher than that of said low concentration source resistance control region.

3. The semiconductor device according to claim 1, wherein
said high concentration source resistance control region is formed by performing an ion implantation on said surface layer part of said drift layer, and
a thickness of said high concentration source resistance control region is 0.1 μm to 3.0 μm.

4. The semiconductor device according to claim 1, wherein
said high concentration source resistance control region is made up of an epitaxial growth layer formed on a surface of said drift layer, and
a thickness of said high concentration source resistance control region is 0.05 μm to 0.5 μm.

5. The semiconductor device according to claim 1, wherein
a first conductivity type impurity concentration of said high concentration source resistance control region is larger by at least one digit than a first conductivity type impurity concentration of said low concentration source resistance control region.

6. The semiconductor device according to claim 1, wherein
said high concentration source resistance control region is completely depleted by a depletion layer formed by a p-n junction between said source resistance control region and said well region in an on-state in a normal operation.

7. The semiconductor device according to claim 1, wherein
said high concentration source resistance control region is not completely depleted by a depletion layer formed by a p-n junction between said source resistance control region and said well region in an on-state in a normal operation.

8. The semiconductor device according to claim 1, wherein
a conductivity type of said low concentration source resistance control region is a second conductivity type.

9. The semiconductor device according to claim 1, wherein
said well region has a retro-grade type impurity concentration profile.

10. The semiconductor device according to claim 1, wherein
at least said low concentration source resistance control region, in said low concentration source resistance control region and said high concentration source resistance control region, is made up of an epitaxial growth layer formed on a surface of said drift layer.

11. The semiconductor device according to claim 10, wherein
said epitaxial growth layer constituting said low concentration source resistance control region extends to a part located above said channel region and said drift layer adjacent to said channel region.

12. The semiconductor device according to claim 1, further comprising
a Schottky electrode which is formed on said drift layer, Schottky-connected to said drift layer, and electrically connected to said source region.

13. The semiconductor device according to claim 2, wherein
said high concentration source resistance control region is formed by performing an ion implantation on said surface layer part of said drift layer, and
a thickness of said high concentration source resistance control region is 0.1 μm to 3.0 μm.

14. The semiconductor device according to claim 2, wherein
said high concentration source resistance control region is made up of an epitaxial growth layer formed on a surface of said drift layer, and
a thickness of said high concentration source resistance control region is 0.05 μm to 0.5 μm.

15. The semiconductor device according to claim 2, wherein
a first conductivity type impurity concentration of said high concentration source resistance control region is larger by at least one digit than a first conductivity type impurity concentration of said low concentration source resistance control region.

16. The semiconductor device according to claim 2, wherein
said high concentration source resistance control region is completely depleted by a depletion layer formed by a p-n junction between said source resistance control region and said well region in an on-state in a normal operation.

17. The semiconductor device according to claim 2, wherein
said high concentration source resistance control region is not completely depleted by a depletion layer formed by a p-n junction between said source resistance control region and said well region in an on-state in a normal operation.

18. The semiconductor device according to claim 2, wherein
a conductivity type of said low concentration source resistance control region is a second conductivity type.

19. The semiconductor device according to claim 2, wherein
said well region has a retro-grade type impurity concentration profile.

20. The semiconductor device according to claim 2, wherein
at least said low concentration source resistance control region, in said low concentration source resistance control region and said high concentration source resistance control region, is made up of an epitaxial growth layer formed on a surface of said drift layer.

21. The semiconductor device according to claim 20, wherein
said epitaxial growth layer constituting said low concentration source resistance control region extends to a part located above said channel region and said drift layer adjacent to said channel region.

22. The semiconductor device according to claim 2, further comprising
a Schottky electrode which is formed on said drift layer, Schottky-connected to said drift layer, and electrically connected to said source region.

* * * * *